(12) United States Patent
Minotani et al.

(10) Patent No.: US 9,043,663 B2
(45) Date of Patent: May 26, 2015

(54) APPARATUS AND METHOD FOR TESTING A MEMORY

(71) Applicant: FUJITSU LIMITED, Kawasaki-shi, Kanagawa (JP)

(72) Inventors: Katsuhiko Minotani, Kawasaki (JP); Takahiro Osada, Itabashi (JP); Hirokazu Ohta, Edogawa (JP)

(73) Assignee: FUJITSU LIMITED, Kawasaki (JP)

( * ) Notice: Subject to any disclaimer, the term of this patent is extended or adjusted under 35 U.S.C. 154(b) by 94 days.

(21) Appl. No.: 13/909,671

(22) Filed: Jun. 4, 2013

(65) Prior Publication Data

US 2013/0332784 A1    Dec. 12, 2013

(30) Foreign Application Priority Data

Jun. 7, 2012    (JP) .................. 2012-130260

(51) Int. Cl.
| | |
|---|---|
| G11C 29/00 | (2006.01) |
| G11C 29/08 | (2006.01) |
| G11C 29/10 | (2006.01) |
| G11C 29/42 | (2006.01) |
| G11C 29/04 | (2006.01) |

(52) U.S. Cl.
CPC ............. *G11C 29/08* (2013.01); *G11C 29/10* (2013.01); *G11C 29/42* (2013.01); *G11C 2029/0401* (2013.01)

(58) Field of Classification Search
CPC ...................................................... G11C 26/56
USPC ................... 714/718, 723, 764, 27
See application file for complete search history.

(56) References Cited

U.S. PATENT DOCUMENTS

| | | | |
|---|---|---|---|
| 5,473,753 A | 12/1995 | Wells et al. | |
| 6,469,945 B2* | 10/2002 | Patti et al. | ............. 365/201 |
| 7,359,274 B2* | 4/2008 | Noguchi et al. | ......... 365/230.03 |
| 7,987,407 B2* | 7/2011 | Gille et al. | ............. 714/764 |
| 2009/0204752 A1 | 8/2009 | Sasaki | |

FOREIGN PATENT DOCUMENTS

| | | |
|---|---|---|
| JP | 61-131050 | 6/1986 |
| JP | 6-208799 | 7/1994 |
| WO | WO 2008/047443 | 4/2008 |

* cited by examiner

*Primary Examiner* — Fritz Alphonse
(74) *Attorney, Agent, or Firm* — Staas & Halsey LLP

(57) ABSTRACT

An apparatus is equipped with a storage device including an error correction circuit. The apparatus performs a test of the storage device according to a predetermined testing procedure, and records a time-point at which error correction of the storage device has been performed by the error correction circuit during performance of the test. The apparatus determines, with predetermined accuracy, a first position within the storage device on which the error correction has been performed, based on a test speed at which the test is performed, a time-period from the time-point to current time, and a second position within the storage device on which the test is being performed at the current time. Then, the apparatus performs the test predetermined times on a range included in the storage device and including the first position, according to a testing procedure that has been used at the time-point.

9 Claims, 21 Drawing Sheets

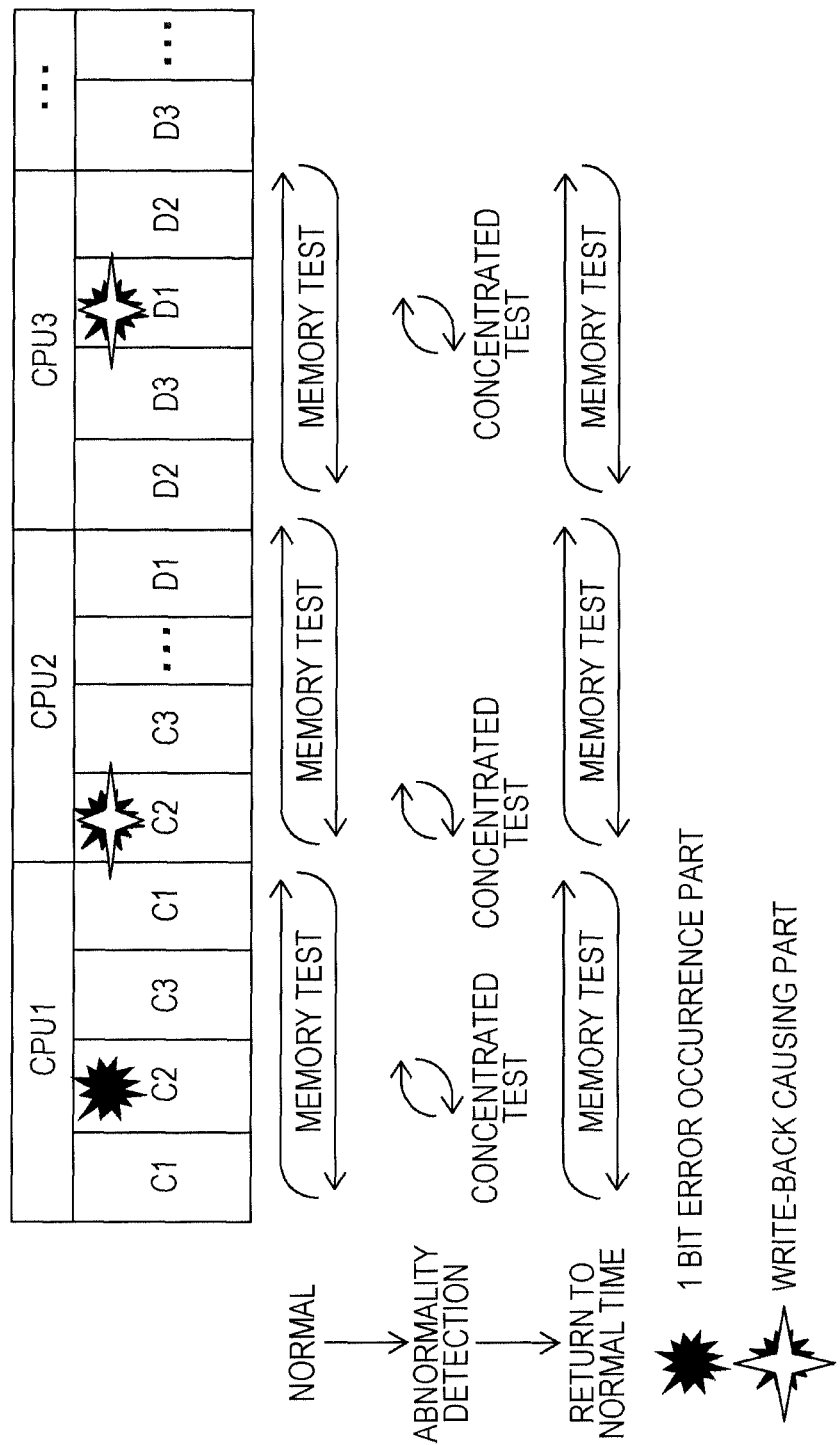

APPARATUS AND METHOD FOR TESTING A MEMORY

CROSS-REFERENCE TO RELATED APPLICATION

This application is based upon and claims the benefit of priority of the prior Japanese Patent Application No. 2012-130260, filed on Jun. 7, 2012, the entire contents of which are incorporated herein by reference.

FIELD

The embodiments discussed herein are related to apparatus and method for testing a memory.

BACKGROUND

As one of problems in an information processing device, of which high availability of a system is sought, such as a server of a backbone system, a bit error countermeasure with respect to a soft error of a memory, for example, may be cited. Such information processing device employs an error check and correct (ECC) memory which includes an error detecting and correcting function as a countermeasure with respect to system down caused by a bit error of a memory. Upon occurrence of a bit error of a memory, the ECC memory is capable of detecting an occurrence position of the bit error and correcting the erroneous bit.

Further, in an information processing device such as a server in recent years, a management controller or the like monitors an error notification register of a memory in a memory controller. For example, a management controller counts the number of times of an occurrence of a bit error of a memory by using an error notification register of a memory. Further, the management controller has a mechanism to report as a failure of a memory when the number of times of an occurrence of a bit error exceeds a threshold value.

As a testing method of an ECC memory, the following test has been employed in the related arts, for example.

(1) A test for executing writing and reading of data by using various data patterns such as a crosstalk noise pattern.

(2) A test for specifying a memory block unit suitable for high-speed memory access by a cache on the basis of a cache size of a CPU which performs memory access, so as to execute moving or copying of data in the specified memory block unit.

(3) A test for performing quality determination of a memory on the basis of presence/absence of an occurrence of an uncorrectable error after the above-mentioned tests of (1) and (2) and the like. An uncorrectable error indicates, for example, bit errors the number of which exceeds the number of bits that are error correctable.

(4) A test for performing quality determination of a memory on the basis of whether or not frequency of occurrence of bit errors exceeds a threshold value, after the above-mentioned tests of (1) and (2) and the like.

In the related arts, quality has been maintained by repeatedly performing the tests illustrated in the above procedure with respect to test objects of all memory cells and memory addresses within a predetermined time period.

International Publication Pamphlet No. WO 2008/047443, Japanese Laid-open Patent Publication No. 6-208799, and Japanese Laid-open Patent Publication No. 61-131050 are examples of the related arts.

SUMMARY

According to an aspect of the embodiment, an apparatus includes a storage device including an error correction circuit. The apparatus performs a test of the storage device according to a predetermined testing procedure, and records a time-point at which error correction of the storage device has been performed by the error correction circuit during performance of the test. The apparatus determines, with predetermined accuracy, a first position within the storage device on which the error correction has been performed, based on a test speed at which the test is performed, a time-period from the time-point to current time, and a second position within the storage device on which the test is being performed at the current time. The apparatus performs the test predetermined times on a range included in the storage device and including the first position, according to a testing procedure that has been used at the time-point.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a diagram illustrating an example of processing performed by a test program, according to an embodiment;

DESCRIPTION OF EMBODIMENTS

In the repeated test performed in the related arts, the test has been executed, for example, by switching test object addresses. However, in the testing method of the related arts, there is a case where frequency at which a specific address is set as a test object is decreased in proportion to increase of a capacity of a memory which is a test object and frequency of error occurrence does not become equal to or greater than a threshold value. For example, regarding a mass-production test of an information processing device such as a server, there is such case that frequency with which a suspected part becomes a test object is decreased even in a case of a memory that has high frequency of error occurrence and includes a part suspected to be defective. As a result, a memory including the part suspected to be defective may be determined as non-defective.

Therefore, according to a testing method of the related arts, the number of times of error correction may not reach a predetermined threshold value and a memory mounted on an information processing device may be determined as non-defective and may flow out to the field. Then, a field failure, which is caused by the defect of a memory, such as memory degeneracy, may be exposed after the memory has flown out to the field. When a memory failure occurs in a large-scale information processing device, the information processing device makes the shift to a degeneracy operation. As a result, in an information processing device in which the failure has occurred, performance is degraded by a degree of the degenerated amount of hardware resources.

An information processing device according to embodiments is described below with reference to the accompanying drawings. The configuration of the embodiments below is an exemplification and the device of the present disclosure is not limited to the configuration of the embodiments.

Comparison Example

Figure 1:
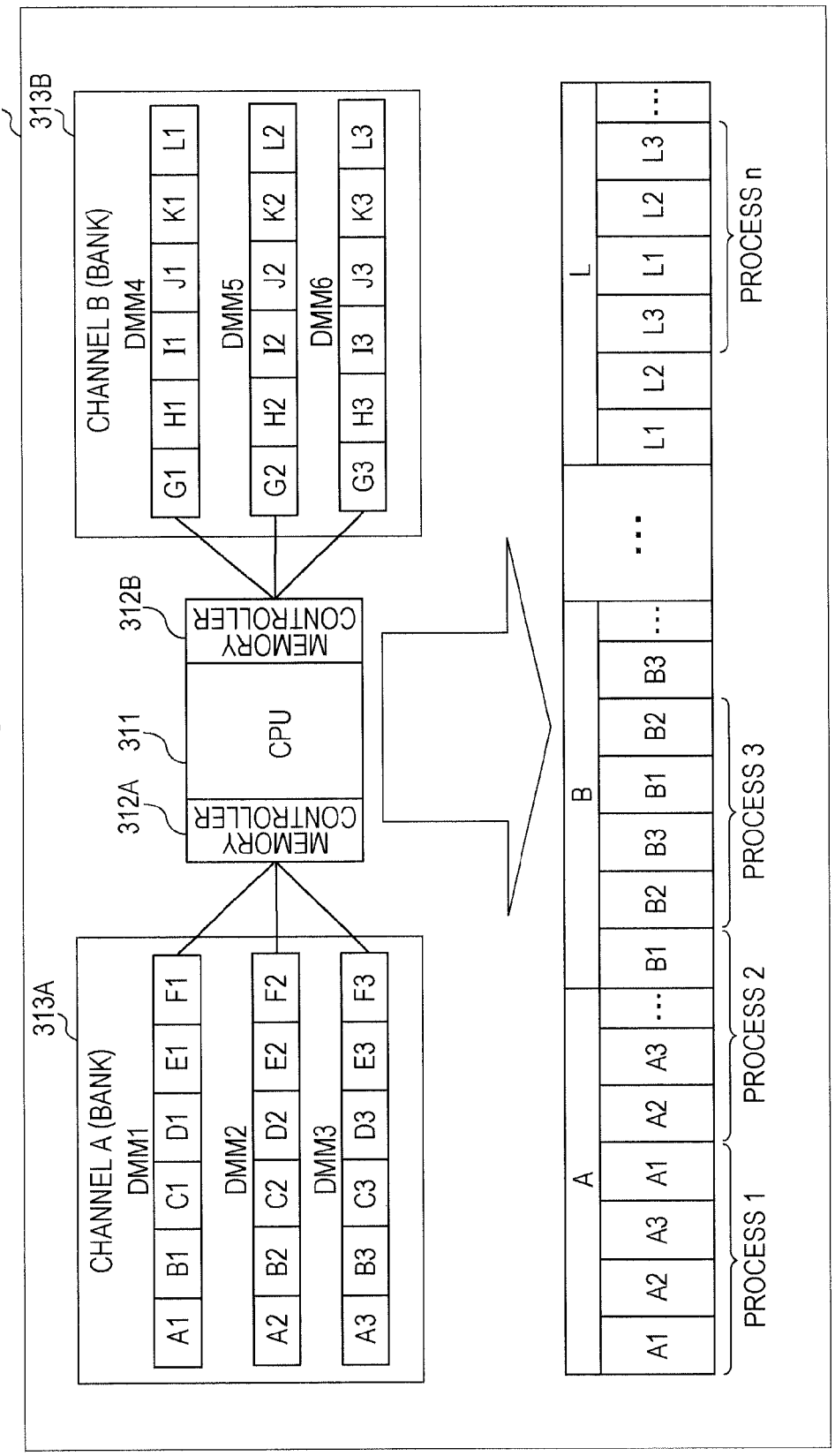
FIG. 1 is a diagram illustrating a comparison example of a configuration of an information processing device for executing a procedure of testing a memory.

FIGS. 1 to 4 each illustrate a method for testing a memory according to a comparison example. FIG. 1 is a diagram illustrating a comparison example of a configuration of an information processing device for executing a procedure of testing a memory. An information processing device 310 includes a CPU 311, memory controllers 312A and 312B, a memory which is connected to the memory controllers 312A and 312B, and peripheral equipment, where the CPU 311 includes a plurality of cores.

The memory controllers 312A and 312B control access to memories on memory modules which are attached to a plurality of memory slots, via the memory channels 313A and 313B, respectively. A memory module is also called a dynamic memory module (DMM). The information processing device 310 includes memory modules DMM 1 to DMM 3 which are connected via a channel 313A and serve as a first bank. The information processing device 310 further includes memory modules DMM 4 to DMM 6 which are connected via a channel 313B and serve as a second bank.

The memory controllers 312A and 312B access the first bank and the second bank in parallel via the channels 313A and 313B, respectively. However, memory spaces formed by memory modules such as the DMM 1 to the DMM 6 are assigned, without recognition of difference between the channels 313A and 313B, to respective processes which are executed in the CPU 311 of the information processing device 310. For example, a memory space is sectioned into regions A to L. Then, blocks A1, A2, A3, and A1 in the region A are assigned to process 1. In FIG. 1, a label attached to a block is merely a name indicating an arbitrary partial region on which a memory test is performed and the arbitrary partial region indicated by the label is not especially limited.

Here, the reason why the block A1 is assigned twice to the process 1 in FIG. 1 is that two parts of the block A1 are assigned respectively. In a similar manner, blocks A1, A2, A3, and B1, for example, are assigned to process 2. Thus, parts of the blocks A1 to A3 are assigned to the process 1 and other parts of the blocks A1 to A3 are further assigned to the process 2.

Figure 2:
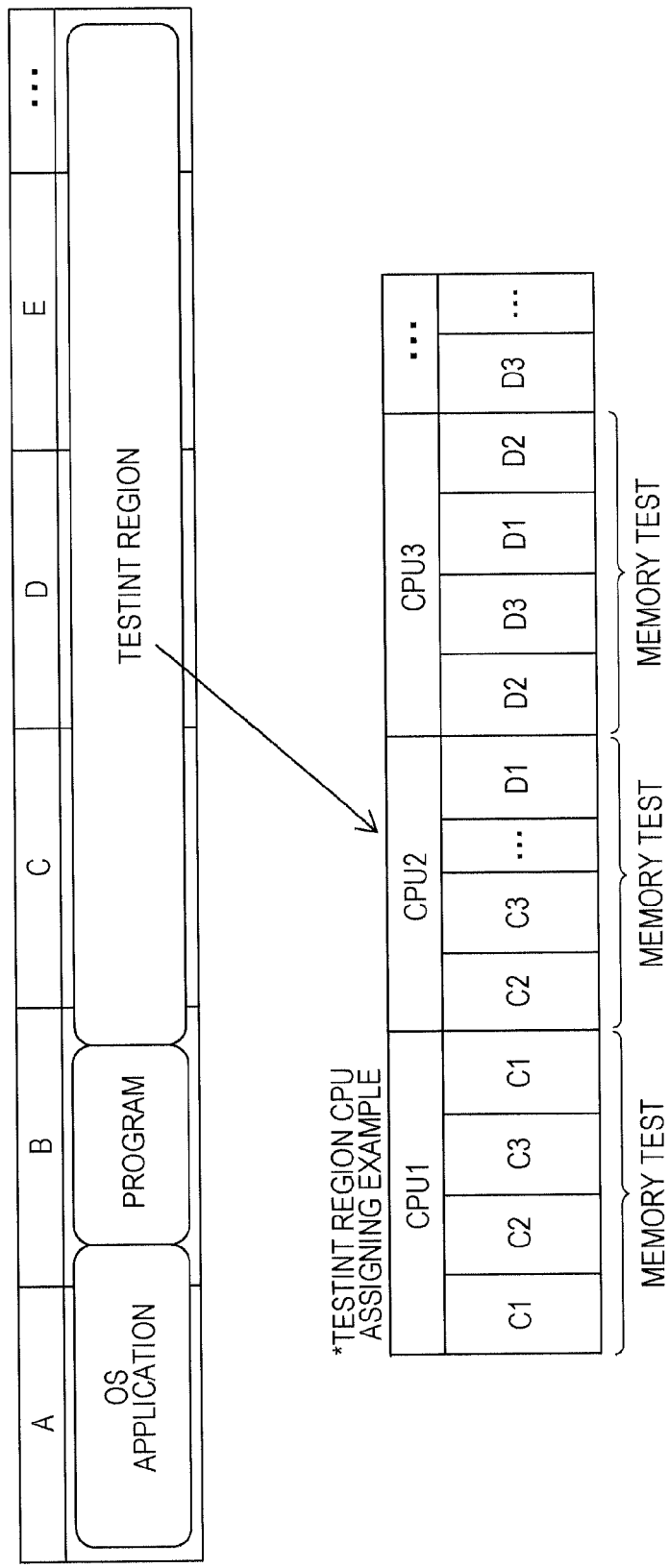
FIG. 2 is a diagram illustrating a comparison example of a testing procedure.

FIG. 2 is a diagram illustrating a comparison example of a testing procedure. In an example of FIG. 2, programs such as an operating system (OS) and an application program are stored in a memory space including regions A and B and the like. Further, part of the region B, regions C to E, and the like are a testing region.

Further, the testing region of the memory space is assigned to a process of a test program which is executed for every core of the CPU 311. In this example, cores are a CPU 1, a CPU 2, a CPU 3, and the like, for example. Then, respective parts of blocks C1, C2, C3, and C1 are assigned to a process of a test program which is executed in the core CPU 1. Here, the block C1 and the like are blocks of a physical memory such as the DMM 1 depicted in FIG. 1. However, a process of the test program executed, for example, by the core CPU 1 accesses a memory on a virtual space to execute a test of the block C1 or the like of the physical memory via the OS. A relationship between the CPU 2 and blocks C2, C3, and D1, a relationship between the CPU 3 and blocks D2, D3, D1, and D2, and the like are same as the above-described relationship between the CPU 1 and the block C1 and the like.

Figure 3:
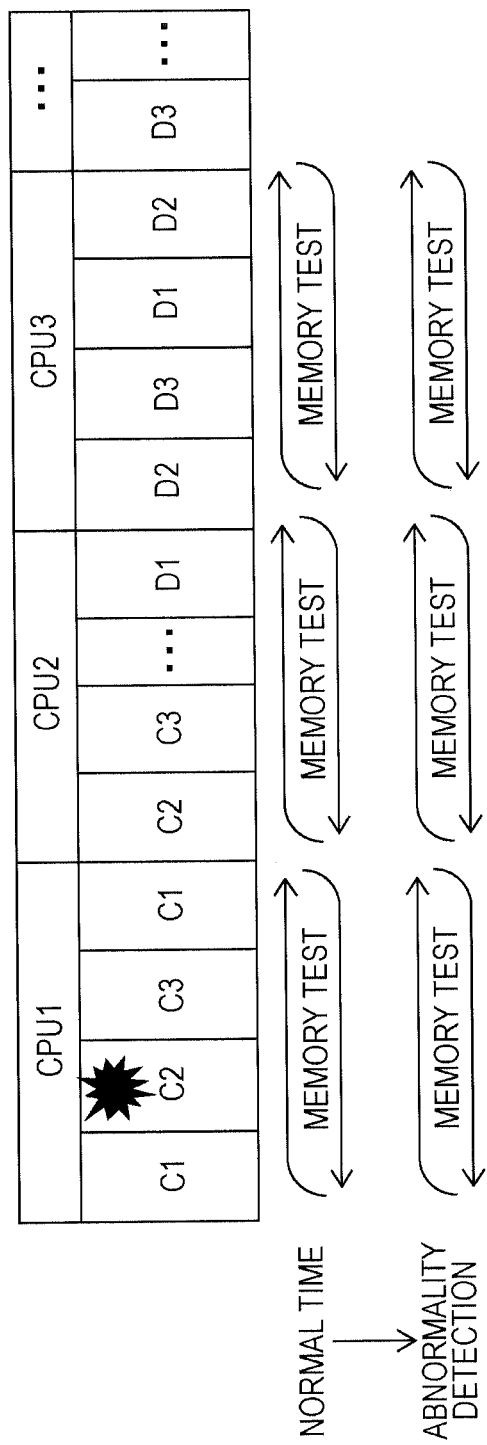
FIG. 3 is a diagram illustrating an example of a procedure of a memory test performed by a plurality of processes.

FIG. 3 is a diagram illustrating an example of a procedure of a memory test performed by a plurality of processes assigned to respective cores of a CPU. In this example, a block move test and the like are executed as a memory test. In an environment in which memory interleaving is applied by the channels 313A and 313B and the like as the information processing device 310 depicted in FIG. 1, there is a case where the same region on a memory bank is accessed by a plurality of processes at the same timing in a memory test. "The same region is accessed at the same timing" indicates, for example, a case where the same region is accessed by the plurality of processor at the same clock cycle. When the same region is accessed at the same timing, the possibility of a 1 bit-error occurrence caused by access competition for the same region may be increased. For example, the possibility of an occurrence of write-back from a cache to a memory may be increased due to successive access in which boundary intervals are accorded with each other, successive access to the same cache line, or the like.

In FIG. 3, a 1 bit error is detected in a block C2 of the CPU 1. Further, parts of the block C2 in a testing region are respectively assigned to the CPU 1 and the CPU 2 by memory interleaving. Further, an occurrence of a bit error (a star sign in FIG. 3), of which one factor is caused by an occurrence of access competition for the block C2 at the same timing in memory tests by a plurality of processes, is observed.

However, in the testing method of the above example, the whole of respective testing coverage regions is continuously tested in a memory test by a plurality of processes. That is, in the procedure of FIG. 3, even if a bit error occurs in the block C2 by a testing process of the CPU 1, testing processes executed in the core CPUs 1 to 3 continue a memory test similar to that before the occurrence of the bit error. Accordingly, in the procedure of the above example, frequency of access competition causing an occurrence of a 1 bit error is decreased.

Further, variation is generated in progress degrees of respective memory tests by a plurality of processes, due to a load caused by processes other than the testing process. Therefore, a gap of timing of access competition which is a failure factor may be increased as respective testing processes repeat a loop of a memory test respectively in the core CPUs 1 to 3. Accordingly, it may be difficult to reproduce a bit error.

Figure 4:
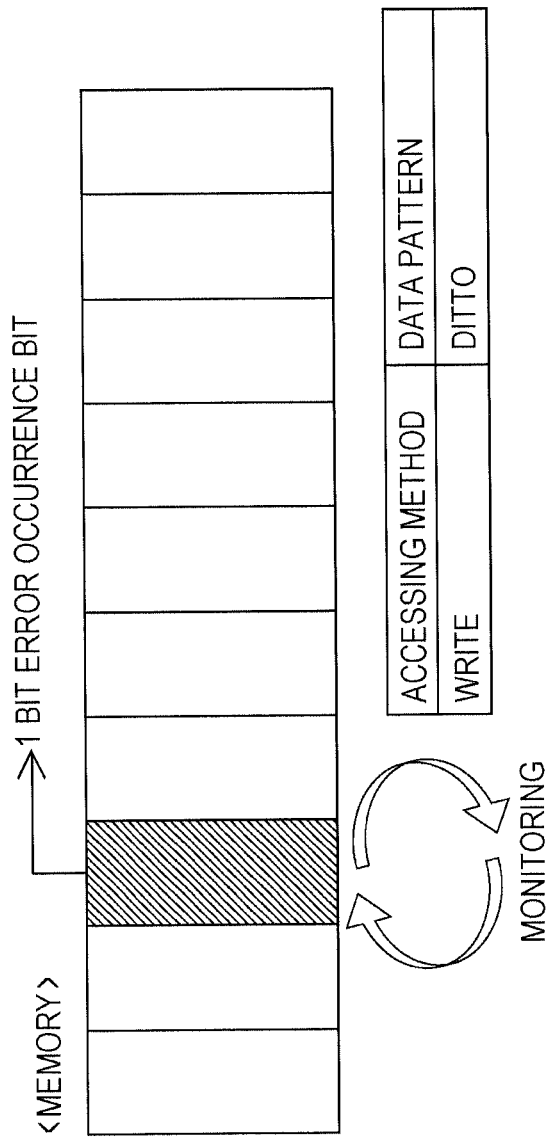
FIG. 4 is a diagram illustrating a comparison example of a procedure of another memory test.

FIG. 4 is a diagram illustrating a comparison example of a procedure of another memory test. In the example of FIG. 4, a reproduction test of a bit error is executed by a simple rewrite access to a part at which a bit error has occurred. However, it is difficult to reproduce the timing of access competition caused by a plurality of core CPUs 1 to 3 even though it is possible to reproduce a test in each core CPU, for example, core CPU 1, in this procedure. Further, a testing procedure of a testing process for each core CPU, for example, the core CPU 1, is limited to a test which uses a single data pattern and is performed by a limited accessing method. This is because a data pattern and an accessing method for causing a bit error is fixed so as to reproduce the data pattern and the accessing method used when a bit error occurs.

Accordingly, with the procedure of the memory test used in the comparison example, it is difficult to sufficiently reproduce an influence of access competition of a plurality of core CPUs 1 to 3 and memory interleaving. Further, a testing pattern is limited and an accessing method is also limited.

First Embodiment

Figure 5:
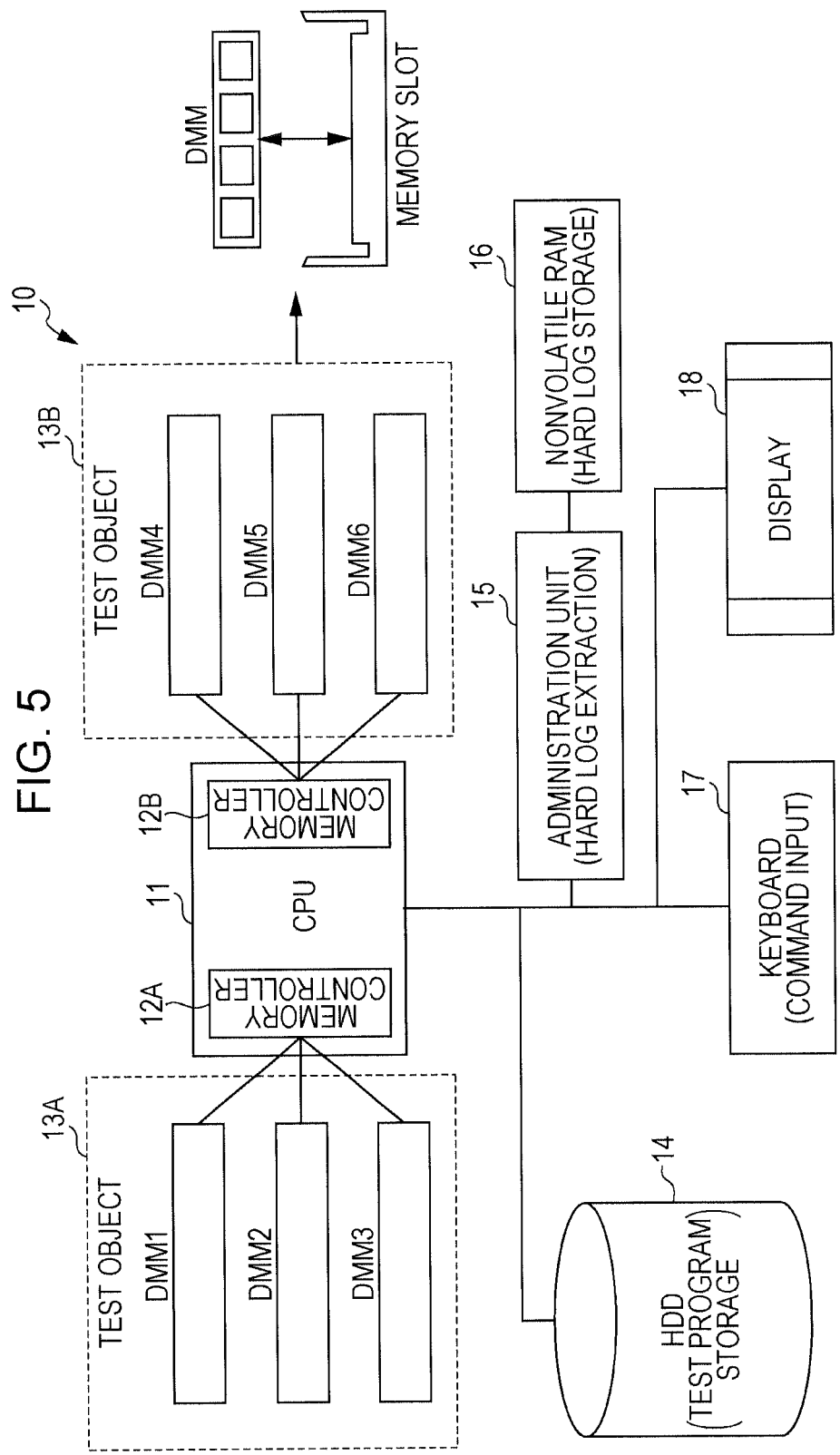
FIG. 5 is a diagram illustrating a configuration example of an information processing device, according to an embodiment.

A procedure of a memory test performed by an information processing device 10 according to an embodiment is described with reference to FIGS. 5 to 9. FIG. 5 is a diagram illustrating a configuration example of an information processing device, according to an embodiment. The information processing device 10 includes a CPU 11, memory controllers 12A and 12B, a memory connected to the memory controllers 12A and 12B, and peripheral equipment, where the CPU 11 includes a plurality of cores.

The memory controllers 12A and 12B control access to a memory on memory modules which are attached to a plurality of memory slots, via memory channels 13A and 13B, respectively. For example, the memory controller 12A controls data input/output between the CPU 11 and a memory bank using, as a single memory bank, a plurality of memory modules attached to respective slots which are connected to the memory channel 13A. In a similar manner, the memory controller 12B controls data input/output between the CPU 11 and a memory bank using, as a single memory bank, a plurality of memory modules attached to respective slots which are connected to the memory channel 13B. Respective cores included in the CPU 11 access memories in parallel via the memory channels 13A and 13B. In FIG. 5, memories illustrated by DMM 1 to DMM 6 are examples of a storage device which includes an error correction circuit. Further, the information processing device 10 is an example of a computer.

FIG. 5 illustrates a dual-channel memory, for example, the memory channels 13A and 13B. However, the information processing device 10 does not limitedly include the dual channel. That is, the information processing device 10 may be configured to include a single memory channel. Further, the information processing device 10 may include three or more pieces of memory channels and may include three or more pieces of memory banks.

The information processing device 10 includes, as the peripheral equipment, for example, a hard disk drive (hereinafter, HDD) 14, an administration unit 15, a nonvolatile random access memory (RAM) 16, a keyboard 17, and a display 18. The HDD 14 stores a test program, test data, and the like, for example.

The administration unit 15 is also called a remote management controller. The administration unit 15 extracts a log of hardware from the nonvolatile RAM 16 in accordance with an instruction from an OS on the CPU 11 to give the extracted log to the OS. In the nonvolatile RAM 16, various types of hardware logs are recorded, such as presence/absence of execution of error correction in an ECC memory, time of execution of error correction, and the number of times of execution of error correction for every time range.

The keyboard 17 is used for command input from a user. Further, various types of information from the information processing device 10 are displayed on the display 18.

Figure 6:
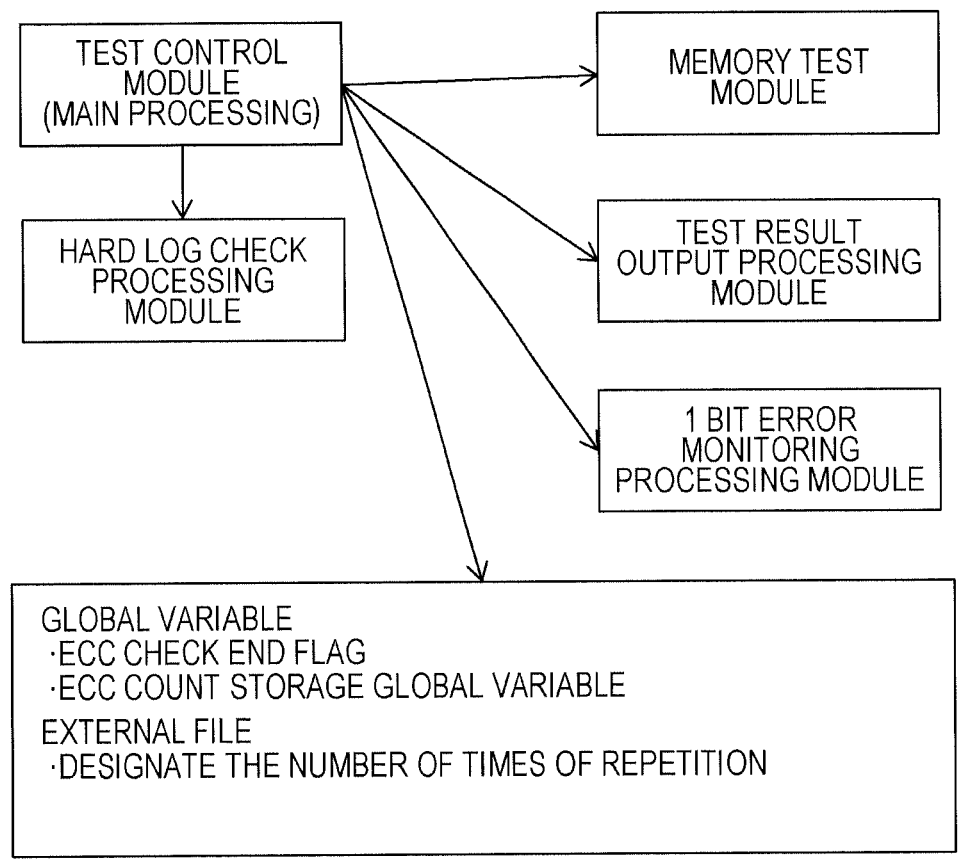
FIG. 6 is a diagram illustrating an example of a relationship between a configuration of a test program and a global variable and external file, according to an embodiment.

FIG. 6 is a diagram illustrating an example of a relationship between a configuration of a test program and a global variable and external file, according to an embodiment. A test program is loaded on a memory from the HDD 14 in an executable format. Any one of cores of the CPU 11 executes the test program on the memory so as to provide functions illustrated in FIG. 6. A test program includes a test control module, a memory test module, a test result output processing module, a 1 bit error monitoring processing module, and a hard log check processing module. However, a configuration of the test program is not limited to the configuration of FIG. 6. Hereinafter, when any one of cores of the CPU 11 is collectively called, the any one of cores of the CPU 11 is referred to simply as CPU 11. Further, in a case where each of the modules of the program of FIG. 6 executes processing by a process including resources such as the CPU 11, this case is expressed simply as "each process executes processing".

The test control module controls execution of a test program upon receiving an instruction from a user via a user interface. For example, the test control module receives a parameter designated by a user and starts up a test using a memory test module, predetermined times within a predetermined address range.

The memory test module executes a test for writing to and reading from a memory. For example, the memory test module is started up by the test control module and executes tests in which, for example, movement and copy of data in a block unit are performed cyclically within a range from an initial address to an end address. The memory test module is executed, as a memory testing process, in respective cores of the CPU 11.

The 1 bit error monitoring processing module acquires a value of a counter expressing the number of times of an occurrence of a bit error in the memory controllers 12A and 12B. Further, the 1 bit error monitoring processing module writes, in a global variable (ECC count storage global variable) of the program, the acquired value of a counter expressing the number of times of an occurrence of a bit error and time at which the value of the counter is acquired. Here, the 1 bit error monitoring processing module may acquire the time from the OS.

The memory test module monitors increase in the ECC count storage global variable, in the process of a loop of the test for writing in and reading from the memory. In the test of writing in and reading from the memory, the memory test module detects an occurrence of a bit error and execution of error correction when the value of the ECC count storage global variable is increased. Then, the memory test module specifies, with predetermined accuracy, an error-occurrence part at which the bit error has occurred, limits the error occurrence part with predetermined accuracy, based on a data pattern and an accessing method that are used when the bit error has occurred, and repeatedly executes a memory test on the limited error occurrence part as an acceleration test.

This allows the memory test module to perform a test, in a concentrated manner, on the vicinity specified by a physical address corresponding to a memory space in which the bit error has occurred, as a suspected position. After the concentrated test, the test on an address space in a core handling the memory test is continued. Consequently, after the acceleration test, the memory test module cyclically performs a test on a range, which corresponds to a test object region in the memory space, from an initial address to an end address on a memory. As a type of the memory test, for example, movement and copy of data in a block unit is performed for a plurality of data patterns.

The hard log check processing module acquires a hard log which is stored in the nonvolatile RAM 16 via the administration unit 15. The hard log check processing module extracts log information such as presence/absence of an occurrence of an uncorrectable error and the number of times an error-corrected bit error has occurred, from the acquired hard log and gives, as a test result, the extracted log information to the test result output processing module.

The test result output processing module outputs the test result, for example, to the display 18. Here, global variables which are accessible from respective modules depicted in FIG. 6 are provided for the CPU 11. For example, even when respective modules of FIG. 6 are executed in different cores of the CPU 11 as independent processes, it is possible for the respective modules to write in and read from the global variables. The global variables include an ECC check end flag and an ECC count storage global variable.

Here, when the ECC check end flag is turned off, processing of the 1 bit error monitoring processing module is started. When the ECC check end flag is turned on, the processing of the 1 bit error monitoring processing module is ended. Further, in the ECC count storage global variable, monitoring results of the memory controller 12A and 12B obtained by the 1 bit error monitoring processing module, that is, presence/absence and time of an occurrence of an uncorrectable error, a value of a counter representing the number of times a correctable error has occurred, and time at which the correctable error has occurred are stored.

Further, an external file is provided on the HDD 14. As described above, a parameter which is designated by a user and input via a user interface of the test control module, such as the number of times a memory test is repeated by the memory test module, is stored in the external file.

Further, the test control module instructs the 1 bit error monitoring processing module to start processing by turning off the ECC check end flag in accordance with a user operation from the user interface. When the ECC check end flag is turned off, the 1 bit error monitoring processing module starts the processing. That is, in each of cores of the CPU 11, the 1 bit error monitoring processing module monitors a bit error counter as the ECC check process. Then, the 1 bit error monitoring processing module reports a monitoring result to the memory test program via the ECC count storage global variable. In the first embodiment, although a bit error is not limited to a 1 bit error, the description is provided based on an assumption that the number of error-correctable bits is 1. However, even if the number of error-correctable bits is two or more, the memory testing method of the first embodiment is applicable.

In each of cores of the CPU 11, the memory test program monitors increase in the ECC count storage global variable as a memory testing process so as to confirm presence/absence of an occurrence of a bit error. When the memory test program recognizes an occurrence of a bit error through increase in the ECC count storage global variable, the memory test program starts processing of an acceleration test for a 1 bit error occurrence.

FIG. 7 is a diagram illustrating an example of processing performed by a test program, according to an embodiment. FIG. 7 illustrates the CPUs 1 to 3 as respective cores of the CPU 11. However, the number of cores is not limited to three. In the description below, when the respective core CPU 1 to CPU 3 are collectively called, the CPU 1 to the CPU 3 are referred to simply as the CPU 11.

The CPUs 1 to 3 respectively execute the memory test module and execute a test of memories within respective coverage address ranges of a memory spaces. For example, in a normal state, the memory test module tests a predetermined address range in the memory space of the CPU 1 or the like. As a result, the memory test module executes a test with respect to a region of a physical memory corresponding to the address range in the memory space, such as the blocks C1, C2, C3, and C1. Further, the CPU 2 executes a test with respect to the blocks C2, C3, and D1. In a similar manner, the CPU 3 executes a test with respect to part of a memory including the blocks D2, D3, D1, and D2.

For example, it is assumed that a bit error is detected and error correction is executed in a range of the block C2. In this case, the memory test module specifies the block C2 in which the error has occurred on the basis of time at which the bit error is detected, time at which the bit error is recognized in the CPU 1, and a speed of the test executed by the CPU 1, that is, time which is used for a test for one block. More specifically, the memory test module specifies a suspected address, in a memory space, corresponding to the block C2 of a memory. Then, the memory test module repeatedly executes a test predetermined times in a concentrated manner with respect to the vicinity of the suspected address corresponding to the block C2 of the memory space of the CPU 1.

Here, it is assumed that a bit error and error correction are not detected in tests of the CPU 2 and the CPU 3. In this case, however, there is a possibility that the tests of the CPU 2 and the CPU 3 have influenced the test of the CPU 1. For example, such case that access to the block C2 has occurred in the CPU 2 as well at time when access to the block C2 has occurred in the CPU 1 is considered. In this case, there is a possibility that cache competition has occurred to have caused a number of occurrences of write-back from a cache to a memory in the test of the CPU 1. As for the CPU 3, there is a possibility that access to a memory by the CPU 3 has influenced the test of the CPU 1 in a similar manner.

Therefore, according to the first embodiment, also in the CPU 2 and the CPU 3, a test is repeatedly executed predetermined times in a concentrated manner with respect to the blocks C2 and D1, to which the CPU 2 and the CPU 3 have respectively executed the test at time when a bit error and error correction are detected in the CPU 1. Thus, also in the CPU 2 and the CPU 3 which are other cores having a potential to have influenced the CPU 1, a test, which was executed by each core at time when the bit error and the error correction in the CPU 1 were detected, is repeatedly executed in a concentrated manner as well as in the CPU 1 which is a core in which the bit error and the error correction were detected. Such processing enables reproduction of a state that a bit error and error correction were detected and effective detection of abnormality of a memory. After executing abnormal detection processing by performing predetermined times of the concentrated test, that is, an acceleration test, each of the core CPUs 1 to 3 may execute a memory test for a normal state.

FIGS. 8A to 8D more specifically illustrate processing performed at a time of a bit error occurrence. Here, a case where the CPU 11 tests a memory bank A and a memory bank B in parallel is described as an example. The memory bank A is a memory which is connected to the memory channel 13A of FIG. 5, for example. Further, the memory bank B is a memory which is connected to the memory channel 13B of FIG. 5, for example. In FIGS. 8A to 8D, memory testing processes A, B, and C are in execution respectively in the CPU 1, the CPU 2, and the CPU 3 which are cores of the CPU 11. The memory testing processes execute a memory test in a manner to handle the predetermined ranges in a memory space of the respective cores, that is, the CPUs 1 to 3, and the blocks C1 to C3 and D1 to D3 of the memory are tested as a result of the execution of the memory test by the memory testing processes. In other words, in the information processing device 10 according to the first embodiment, each process tests a range in a memory space corresponding to a physical block instead of performing a memory test by specifying a physical block of a memory. However, hereinafter, also in such a case as mentioned above, the case will be also expressed, for example, as "each process tests a physical block C1 of a memory" for ease of explanation. When it is possible for the memory test program to designate a physical block of a memory by system call of the OS or the like, the memory test program may execute a memory test by designating a physical block of an actual memory.

(1) Monitoring and Detection of Bit Error Occurrence

Figure 8A:
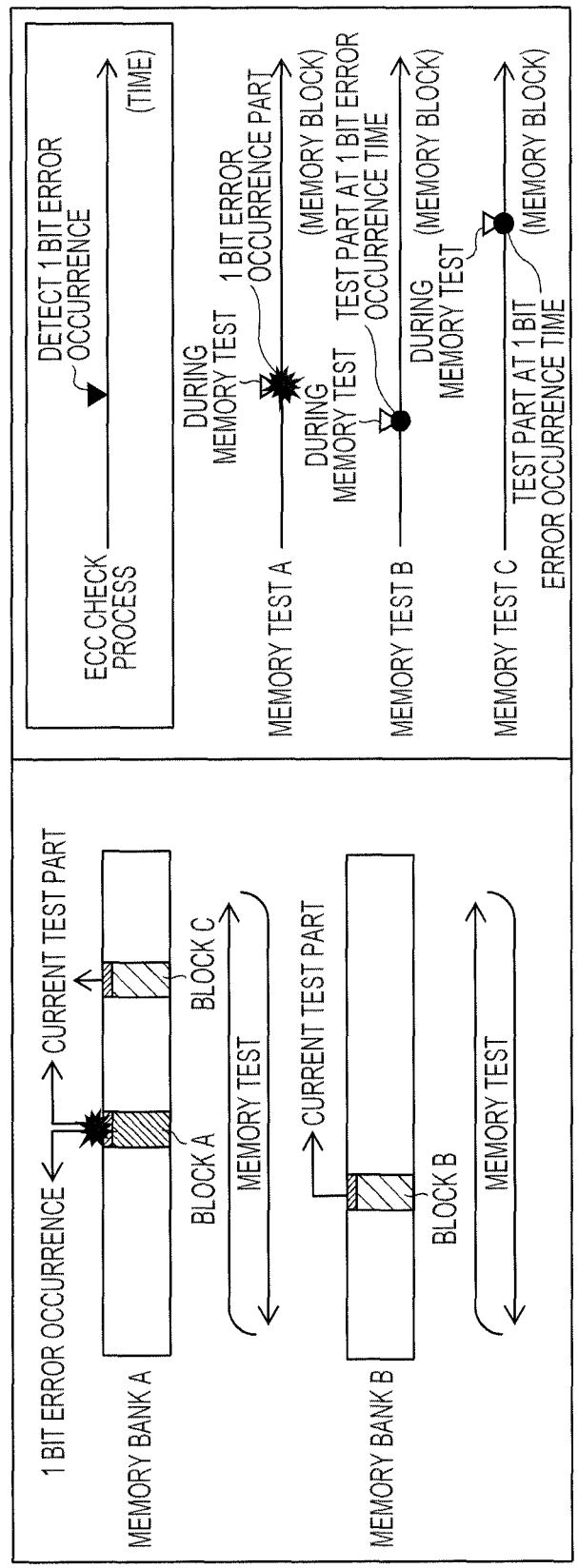
FIGS. 8A to 8D are schematic diagrams illustrating processing performed at a time of a bit error occurrence.

In FIG. 8A, a bit error is occurring at the block A of the memory bank A during a memory test. Further, an ECC check process is detecting the occurrence of the bit error while a memory testing process is testing the block A of the memory bank A, the block B of the memory bank B, and the block C of the memory bank A.

(2) Specifying Suspected Range

Figure 8B:
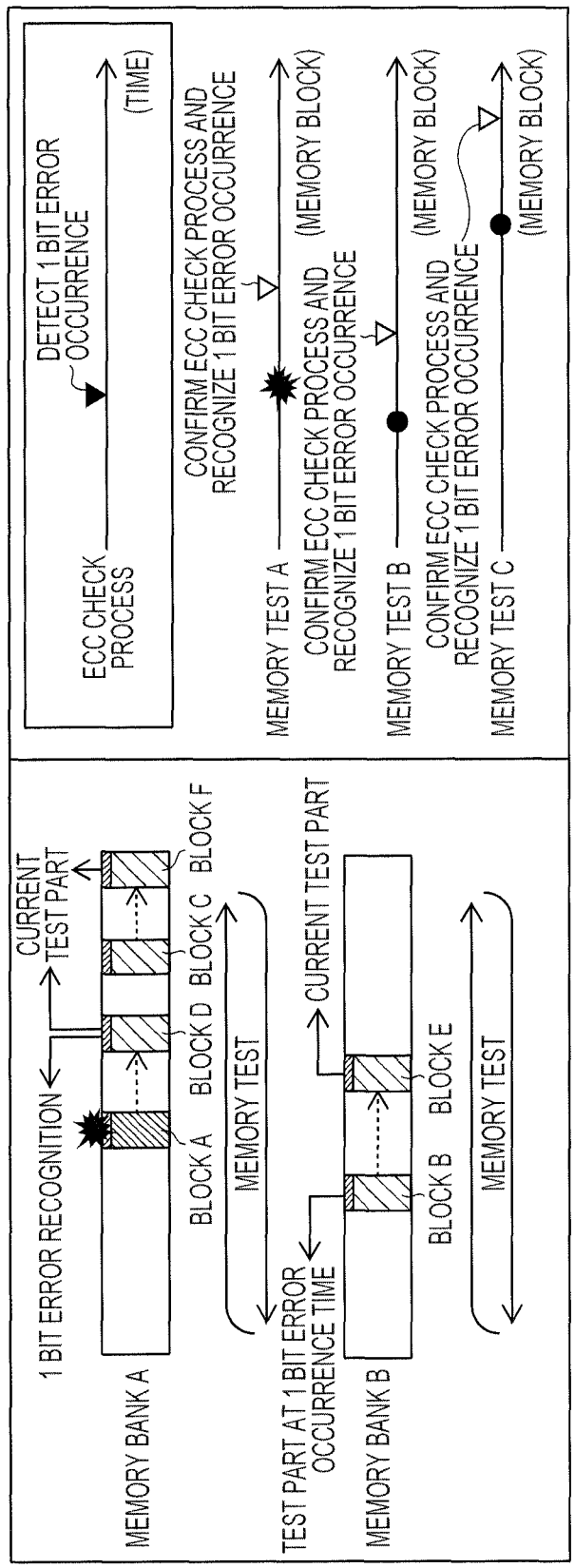

FIG. 8B is a diagram illustrating an example of a testing part at a time when the memory testing process recognizes a bit error occurrence. Since the memory testing processes A, B, and C are executing memory tests, the memory testing processes A, B, and C check whether or not bit error information of the ECC count storage global variable, which is written by the ECC check process at regular intervals, has changed. Therefore, as depicted in FIG. 8B, when the memory testing process recognizes an occurrence of a bit error, the memory testing process is performing a test on a part which is different from a part which was tested at time when the bit error occurred. For example, the memory testing process A is not testing the block A but a block D of the memory bank A. In a similar manner, the memory testing process B is not testing the block B but a block E of the memory bank B. Further, the memory testing process C is not testing the block C but a block F of the memory bank A. That is, a time gap is generated between a part which is currently tested and a suspected part at which a bit error occurred.

Figure 8C:
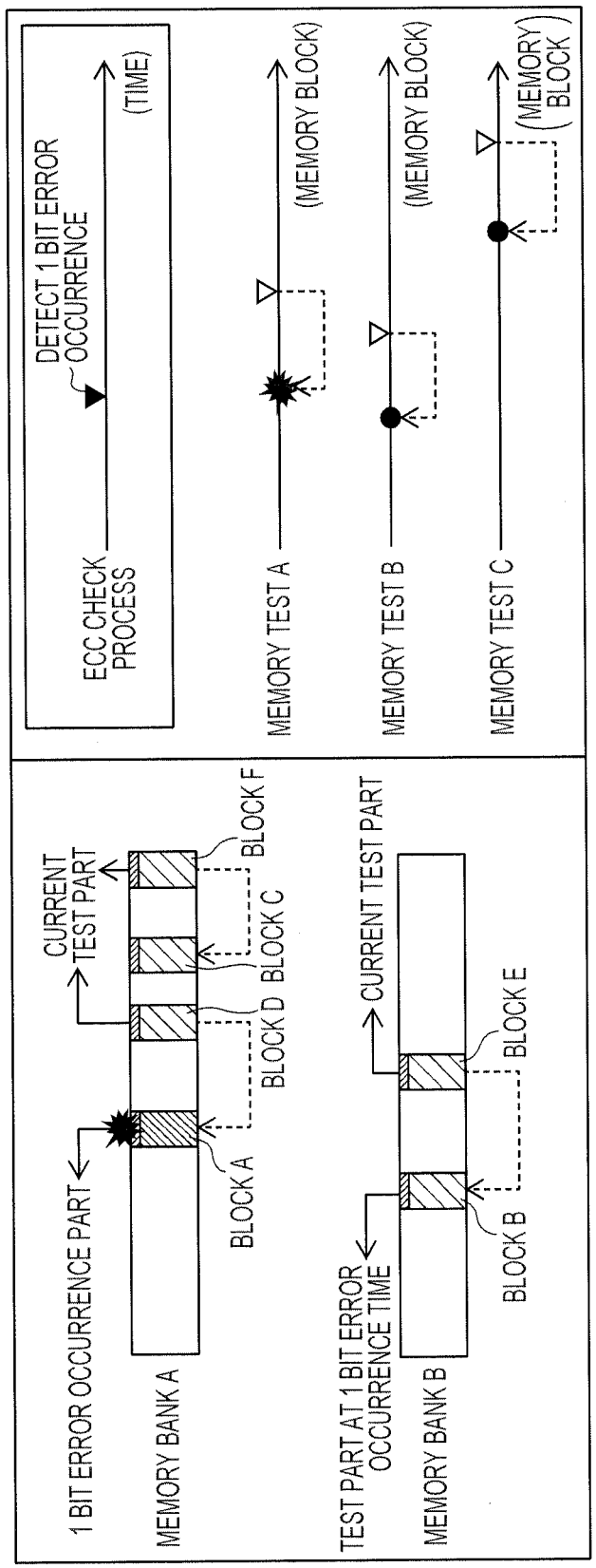

FIG. 8C is a diagram illustrating an example of a relationship between a testing part at a time-point at which the memory testing process recognizes a bit error occurrence and a position on a memory at a time-point at which the bit error has occurred. As depicted in FIG. 8C, the memory testing processes A, B, and C respectively specify the block A of the memory bank A at which a bit error has occurred, the block B of the memory bank B, and the block C of the memory bank A, and set the block A of the memory bank A, the block B of the memory bank B, and the block C of the memory bank A as test objects again. A method in which respective memory testing processes A, B, and C return from error recognition positions to testing parts at a time-point of bit error occurrence.

In the first embodiment, the ECC check process acquires occurrence time at which a bit error has occurred and writes the occurrence time in the ECC count storage global variable. Further, the memory testing process acquires recognition time at which the memory testing process has recognized the bit error. Each of the memory testing processes A, B, and C calculates elapse time from the occurrence time to the recognition time. For example, each of the memory testing processes acquires the number of blocks on which the memory testing process executes a test during one second, and calculates the number of tested blocks on which the test has been performed from a time of bit error occurrence, on the basis of the elapse time from the bit error occurrence. Then, each of the memory testing processes A, B, and C specifies a testing part on which the test was performed at a time of the bit error occurrence, on the basis of the calculated number of tested blocks. Further, each of the memory testing processes designates, as a margin, a suspected range which is a range of addresses that are a given size distant from a suspected part (address).

(3) Acquisition of Data Pattern and Accessing Method

Figure 9:
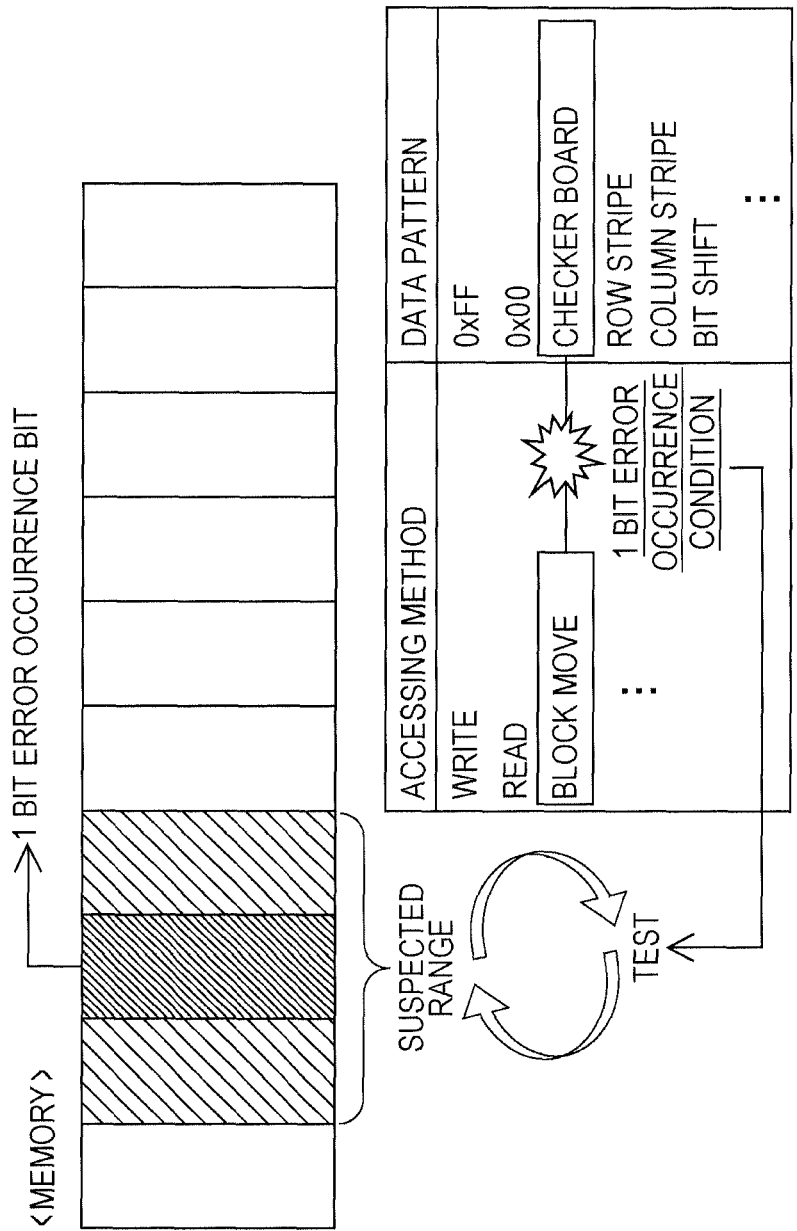
FIG. 9 is a diagram illustrating an example of a data pattern and an accessing method used in a test executed by each memory testing process.

FIG. 9 is a diagram illustrating an example of a data pattern and an accessing method used in a test executed by each memory testing process. FIG. 9 illustrates a test in which a memory test is performed using data patterns in order of data patterns 0xFF, 0x00, and a checker board, in a condition that an accessing method of the memory test is block move. Here, the data pattern 0xFF is a bit string data in which all bits are 1. Further, the data pattern 0x00 is a bit string data in which all bits are 0. The checker board is, for example, a bit string data in which bits 1 and 0 are alternately aligned. For example, the checker board may be generated by: arranging bit-string 0xAA repeatedly in a first word; arranging bit-string 0x55 repeatedly in a second word, and arranging the two-word bit-string data (the first and second words) repeatedly in one block.

Here, a case where a bit error is confirmed in a test of FIG. 9 is described as an example. In the case, such processing that the memory testing process reproduces a data pattern and an accessing method used at a time of a bit error occurrence is illustrated. Here, the memory testing process obtains elapsed time from a bit error occurrence as described above. Then, the memory testing process may acquire a data pattern and an accessing method used at a time-point going back the elapsed time, on the basis of the obtained elapsed time, an accessing method and a data pattern which are currently in execution, and test time for each data pattern and accessing method. Here, the memory testing process may be configured, for example, to record at least one of start time and completion time of the test along with information for identifying each data pattern and accessing method. Then, the memory testing process may read out, from the record, a data pattern and an accessing method at the time-point going back the above-mentioned elapsed time.

In FIG. 9, it is assumed that the memory testing process has specified block move as an accessing method and a checker board as a data pattern, for example. Accordingly, the memory testing process repeatedly executes a test which was executed (writing and reading in such condition that a data pattern is a checker board and an accessing method is block move), with respect to the determined suspected range. When memory interleaving is applied, a data pattern and an accessing method are reproduced for access with respect not only to the suspected range but also to other blocks used during the execution of the test of the suspected range. That is, access is reproduced with respect also to a block of a memory which has been accessed, by memory interleaving, in parallel with access to the suspected range, using a data pattern and an accessing method that are the same as those at a time of the error occurrence. In this sense, an accessing range of other blocks used during execution of a test for the suspected range may be also called a suspected range.

(4) Repeated Test with Respect to Suspected Range

Figure 8D:
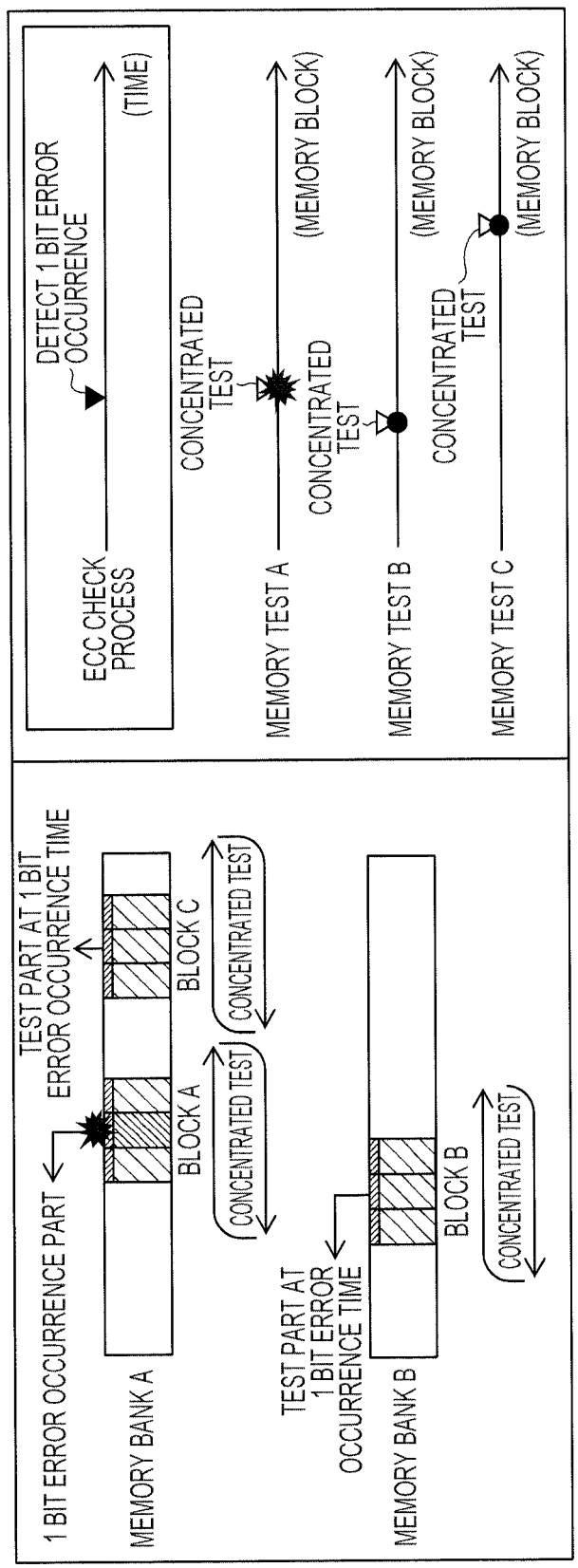

In the procedure illustrated in FIG. 9, the memory testing process repeatedly executes a test predetermined times with respect to the vicinity of the suspected part by using a data pattern and a memory accessing method that have a potential to have caused an occurrence of a bit error with respect to the suspected range. FIG. 8D illustrates a procedure for testing the vicinity of a suspected range. The memory testing processes A, B, and C repeatedly execute a test predetermined times on ranges that have margins of given sizes in vicinities of respective suspected ranges, by using a data pattern and a memory accessing method that have a potential to have caused an occurrence of a bit error with respect to the suspected ranges. After the test which has been repeated predetermined times, a normal test is resumed from on an address next to an address at which the bit error occurred.

Advantageous Effect

As described above, the memory testing process according to the first embodiment, which is illustrated in FIGS. 8A to 8D, tests the suspected range in a concentrated manner by using a data pattern and a memory accessing method for which a bit error occurred, thereby accelerating an occurrence of a bit error in a memory at which a bit error frequently occurred. Accordingly, it becomes possible for the memory testing process of the first embodiment to execute a test so that an error counter exceeds a threshold value, thereby detecting abnormality of the memory.

That is, when the memory test of the first embodiment is applied, the memory testing process selects a suspected range of the block C2 of the CPU 1, and acquires a data pattern and an accessing method for which a bit error occurred. Then, while the memory testing process of the CPU 1 repeatedly executes a test with respect to the above-described suspected range by using the data pattern and the accessing method, other memory testing processes which are executed in other cores of the CPU 11 also repeatedly execute a test on ranges to which the respective memory testing processes were accessing during the test of the suspected range of the block C2 of the CPU 1, by using a data pattern and an accessing method that were employed when the bit error occurred in the block C2 of the CPU 1. Thus, memory testing processes other than a memory testing process for which a bit error occurred also reproduce conditions of the memory test and repeat the memory test predetermined times, thereby prompting reproduction of a situation in which the bit error occurred and increasing a possibility of an occurrence of a 1 bit error. This is because there is a possibility that memory testing processes other than a memory testing process for which a bit error occurred, for example, accelerate an occurrence of writeback and the like with respect to a part of a memory to which the memory testing process for which the bit error occurred accesses and increase bit error occurrence probability.

In the procedure of the memory test of the first embodiment, since a bit error occurrence part to which a margin for designated bits is added is considered as a suspected range, a reproduction test for test states immediately before and immediately after the occurrence of the bit error may be performed with respect to addresses used before and after the occurrence of the bit error. Namely, it is possible to reproduce a state also for an occurrence of a bit error that was caused depending on a relationship with respect to preceding and following parts of a bit error occurrence part (for example, refer to FIG. 12 of a second embodiment).

In the testing method according to the comparison example, since all the memory cells and memory addresses are tested at the same frequency, a test of all the memory cells and memory addresses needs to be continued until error occurrence frequency exceeds a threshold value for a bit error, so as to detect an intended ECC memory in which a bit error frequently occurs. In contrast, a testing method of the first embodiment allows a test to be concentrated on a suspected range using a data pattern and a memory accessing method for which a bit error occurred, reproducing a procedure of each memory testing process. This allows an intended ECC memory for which the number of times of an occurrence of a bit error exceeds a threshold value, to be detected in a shorter period of time than the comparison example.

Thus, an ECC memory having a high bit error occurrence frequency is identified and determined to be defective, so as to prevent the ECC memory from being flowed out to the field. This allows reduction in a frequency of system down caused by a memory error that occurs at time of arrival of shipment or within a short period after the arrival of shipment in the field, and allows reduction in degradation of processing capability caused by increase of memory exchange in the redundant configuration.

That is, unlike the comparison example (FIGS. 3 and 4), the testing procedure of the first embodiment enables concentrated access by writing/reading of data with respect to addresses in the vicinity of a specified bit (suspected range) including an occurrence part of a bit error to be performed by using the most suitable data pattern and accessing method for generating a bit error among various data patterns.

For example, when memory interleaving is applied in the large-scale configuration and a bit error occurs in block movement of the block C2 of the CPU 1 as illustrated in FIG. 3, a bit error may not occur even if the same test in which the bit error occurred is repeatedly performed with respect to a suspected range (vicinity of a block move execution part) of the block C2 of the CPU 1. Therefore, in the memory testing procedure of the first embodiment, a data pattern and an accessing method performed at the time of the occurrence of a bit error are reproduced and a memory test is executed using the reproduced data pattern and the accessing method with respect to the suspected range. Accordingly, it is possible to reproduce a memory test to which an influence of access to a memory by the memory interleaving is also reflected.

As described above, the testing procedure of the first embodiment enables reproduction of an access influence by the CPU 1 with respect to blocks other than C2 and behaviors of processes other than the CPU 1, when a bit error occurs in the block C2 of the CPU 1, thereby enhancing reproducibility of the error and executing a memory test with respect to a suspected range in a concentrated manner.

Second Embodiment

A procedure of a memory test performed by an information processing device 10 according to a second embodiment is described with reference to FIGS. 10 to 18. In the first embodiment, a memory testing method for reproducing access to a memory at a time of an occurrence of a bit error caused by access of a memory testing process of a certain core such as the CPU 1 is described as illustrated in FIGS. 8A to 8D and FIG. 9. Namely, in the first embodiment, a data pattern and an accessing method are reproduced with respect to a suspected range in the CPU 1. Further, a testing procedure which includes reproduction of a behavior of memory testing processes in cores (CPU 2, CPU 3, and the like) other than the CPU 1 is illustrated. In a second embodiment, a further specific processing example for the information processing device 10 is described. The configuration of the information processing device 10 of the second embodiment is same as that of the first embodiment. Accordingly, FIGS. 5 and 6 of the first embodiment are referred for the configuration of the information processing device 10 and the description of the configuration is omitted here.

Figure 10:
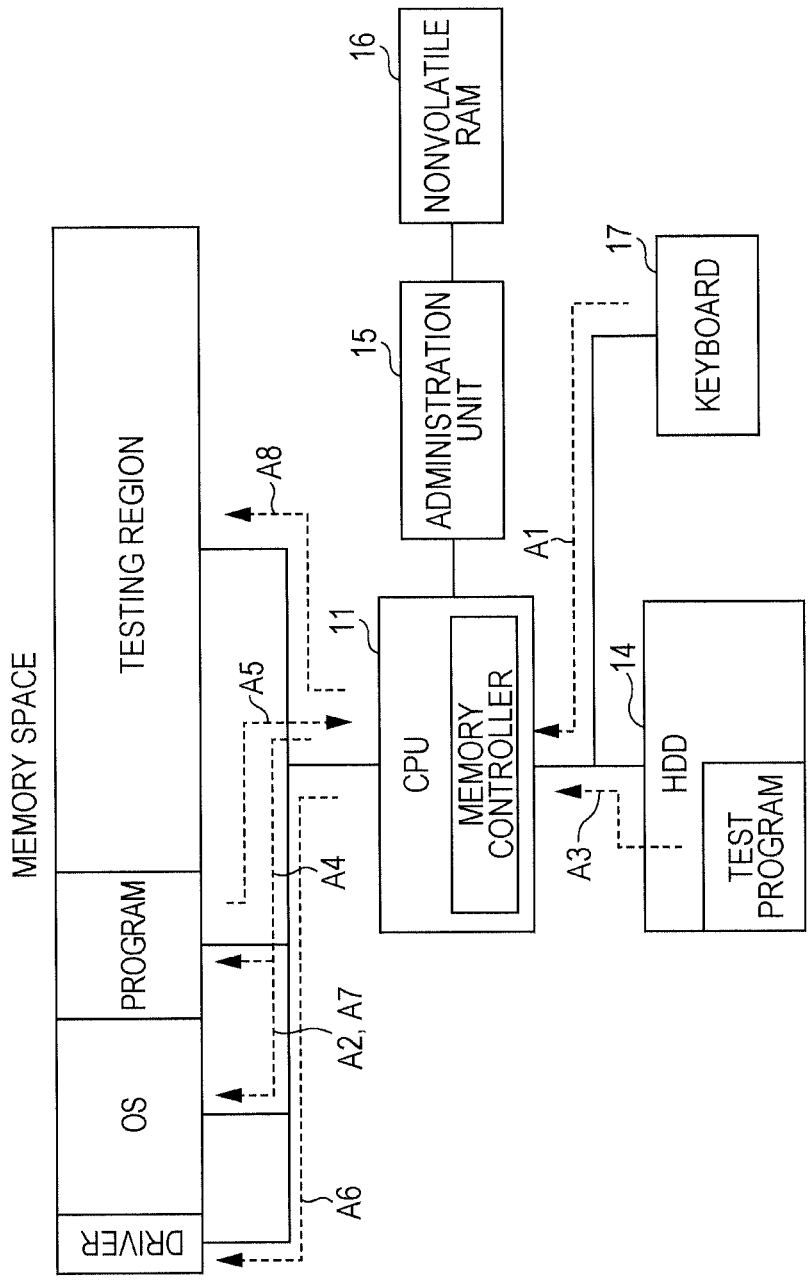
FIG. 10 is a diagram illustrating an example of a procedure of program start-up, according to an embodiment.

FIG. 10 is a diagram illustrating an example of a procedure of program start-up, according to an embodiment. For example, a user inputs a start-up command by a keyboard operation or the like. Then, the CPU 11 of the information processing device 10, for example, the CPU 1 which is one of cores receives the start-up command by the keyboard operation (arrow A1). The description is provided below on the assumption that a start-up command is received at the CPU 1 and a test control module of a memory test program is executed at the CPU 1. However, the test control module of the memory test program may be executed in a core other than the CPU 1. Further, hereinafter, the test control module of the memory test program will be also simply referred to as a memory test program.

The CPU 1 transmits the received start-up command to the OS (arrow A2). Upon receiving the start-up command, the OS loads a test program which is stored in the HDD 14 into a memory (arrows A3 and A4). Further, the OS starts up the test program (arrow A5). By a similar procedure, the memory test program starts up a test program in each core of the CPU 11 so as to progress the test. At this time, the core, which executes the memory test program, of the CPU 11 issues a command to a testing driver, a command to the OS, and the like to control the test (arrows A6 and A7). Through the above-described procedure, the test on a memory testing region is started (arrow A8). As already described in the first embodiment, each core of the CPU 11 executes a memory test module included in the memory test program, as a memory testing process.

Further, the test control module starts up a 1 bit error monitoring processing module as an ECC check process, as is the case with the first embodiment. The ECC check process is executed in parallel with the memory testing process and monitors a bit error counter in a memory controller.

Figure 11:
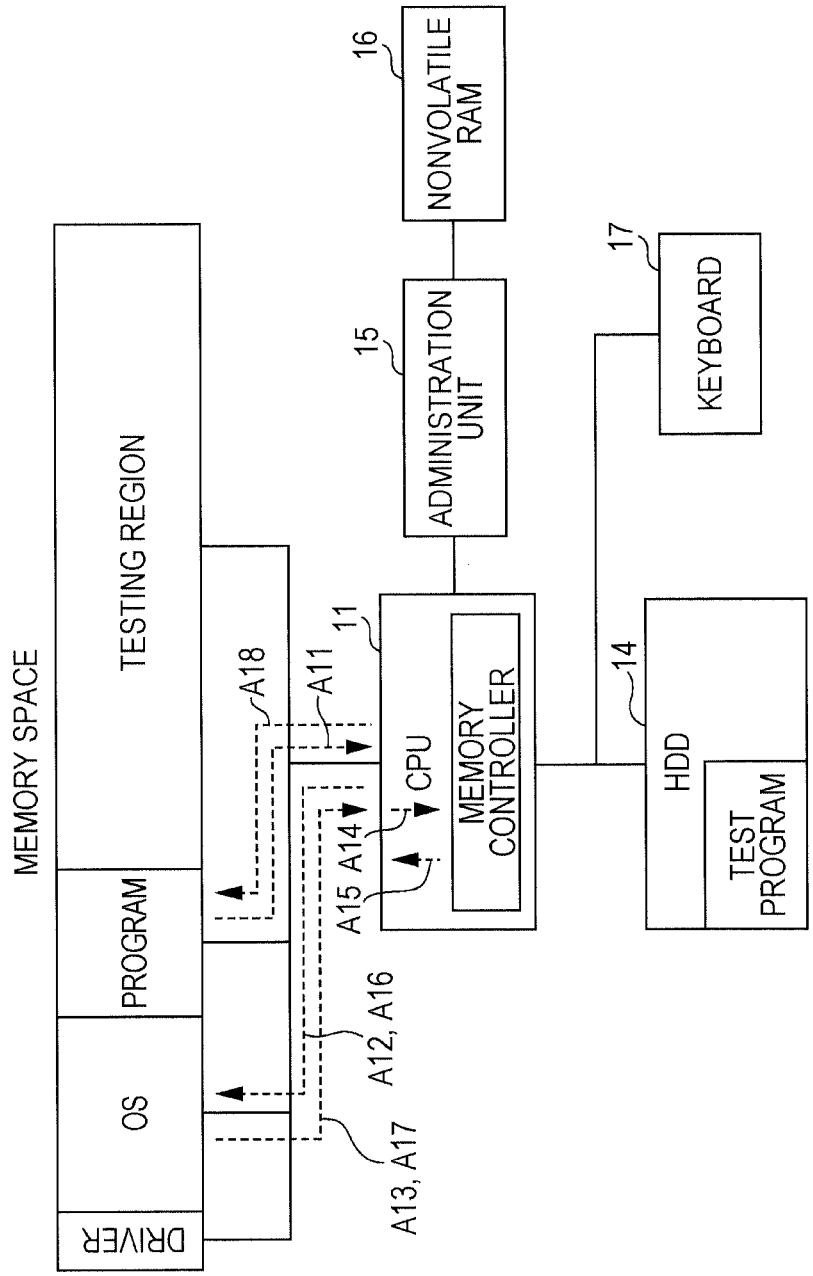
FIG. 11 is a diagram illustrating an example of a procedure of an error check and correct (ECC) check process, according to an embodiment.

FIG. 11 is a diagram illustrating an example of a procedure of an ECC check process, according to an embodiment. For example, the CPU 1 issues an acquisition command for acquiring a bit error count value in the memory controllers 12A and 12B, from the ECC check process via the CPU 1 to the OS (A11, A12).

For example, the OS of the CPU 1 acquires a bit error count value of a memory controller in the CPU 11 (A13, A14, A15, and A16). The OS of the CPU 1 transmits the bit error count value and the like to the ECC check process via the CPU 1 (A17, A18). The ECC check process writes the acquired bit error count value and the like in the ECC count storage global variable (refer to FIG. 6). The memory testing process acquires the bit error count value and the like via the ECC count storage global variable.

Through the above-described procedure, the memory testing process regularly acquires a bit error count during writing and reading of data with respect to an intended ECC memory using various data patterns and during a test of block move so as to confirm presence/absence of increase in an error count.

A determination procedure of error count increase by the memory testing process is illustrated below.

(1) The memory testing process acquires a bit error count value from the ECC check process via the ECC count storage global variable.

(2) The memory testing process confirms presence/absence of increase in the bit error count value by obtaining difference between the acquired bit error count value and an initial value.

(3) When increase is confirmed, the memory testing process determines that a bit error has newly occurred during the memory test and selects a part in which the bit error has occurred. When increase is not confirmed, the memory testing process moves to the following address and continues a normal test.

Figure 12:
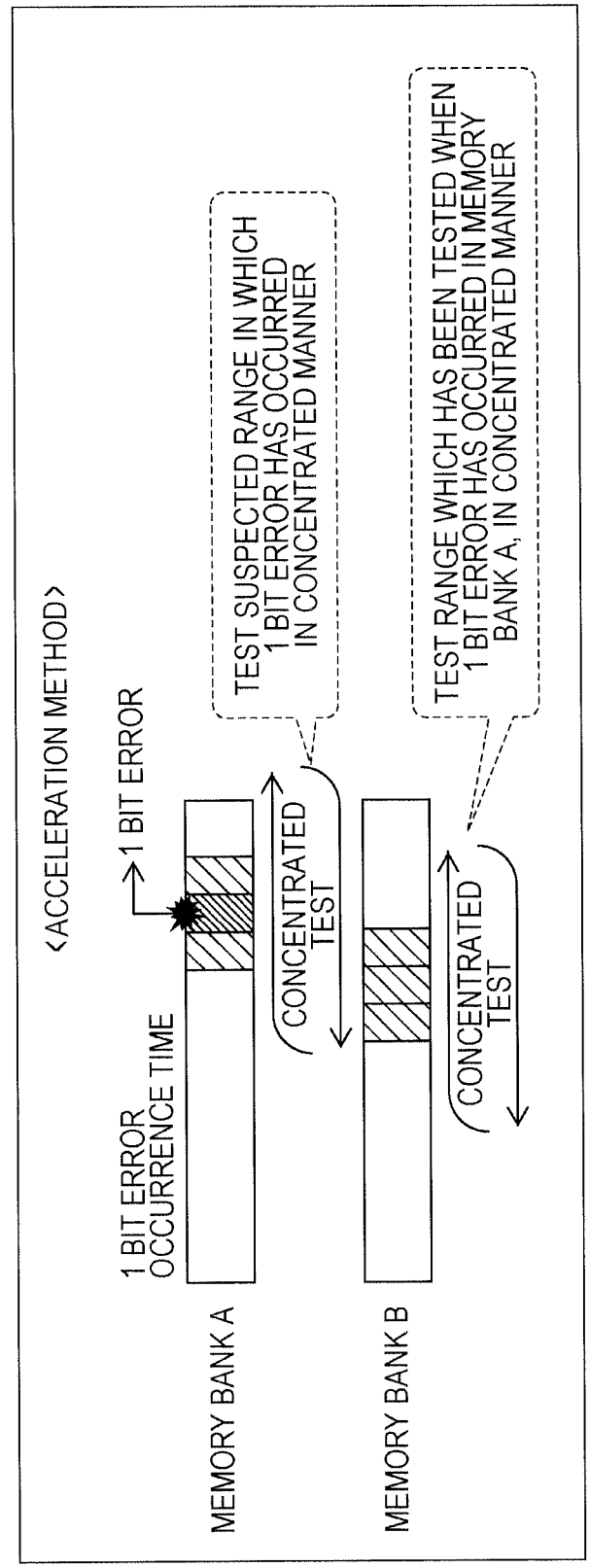
FIG. 12 is a diagram illustrating a processing example of a memory test, according to an embodiment.
Figure 13:
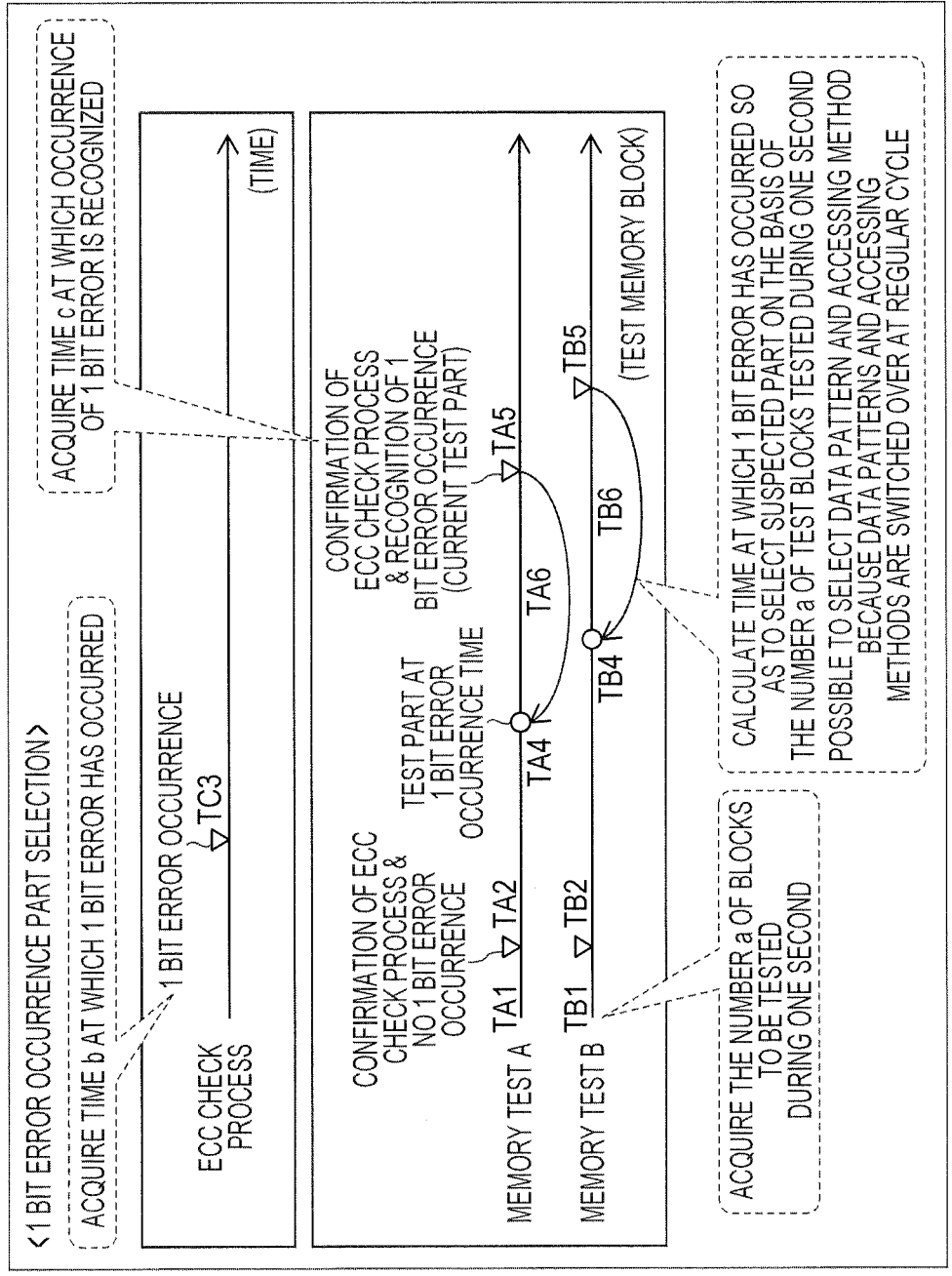
FIG. 13 is a diagram illustrating an example of a procedure of a memory test, according to an embodiment.

FIGS. 12 and 13 illustrate a suspected part selection procedure. FIG. 12 is a diagram illustrating a processing example of a memory test according to an embodiment, and FIG. 13 is a diagram illustrating an example of a procedure of a memory test according to an embodiment. As illustrated in FIG. 13, the memory test program executes an ECC check process which monitors a bit error count and a memory testing process which executes a memory test.

There are as many memory testing processes as the number of memory banks and all the memory testing processes are executed in parallel. The ECC check process and the memory testing process also operate in parallel. Each memory testing process confirms a monitoring result obtained by the ECC check process at every designated time. Accordingly, a gap is generated between a part at which the ECC check process detected a bit error and a part at which the memory testing process recognizes the bit error during a current test. Therefore, the memory testing process returns a range to be tested from a part currently being tested to a part on which the ECC check process detected a 1 bit error. Here, FIG. 13 illustrates memory testing processes A and B, but the number of memory testing processes is not limited to two.

The memory testing processes A and B acquire the number "a" of blocks on which a test is executed in unit second (TA1, TB1).

Each of the memory testing processes A and B confirms whether or not the ECC check process has detected a bit error every time the each of the memory testing processes A and B performs a test at a predetermined time (TA2, TB2). Since variation is generated in progress speeds of the memory testing processes and the numbers of testing blocks depending on a process, variation is also made in timing for confirming the ECC check process, depending on the memory testing process. In this case, since the ECC check process has not detected a 1 bit error, a normal test is continued.

Upon occurrence of a bit error, the ECC check process acquires time "b" at which the bit error has occurred (TC3).

A bit error which has occurred is corrected by an ECC memory function. Therefore, a bit error is not detected by a memory. Further, since the memory testing processes A and B are unable to confirm the ECC check process in the process of memory access, the memory testing processes A and B continue the test even after an occurrence of a bit error.

The memory testing processes A and B recognize the bit error occurrence in the following ECC check process confirmation (TA5, TB5). Each of the memory testing processes A and B acquires time "c" at which each of the memory testing processes A and B recognizes the occurrence of the bit error.

Further, the memory testing processes A and B acquire time "b" of the occurrence of the bit error from the ECC count storage global variable (TA4, TB4). The memory testing processes A and B calculate time from the bit error occurrence to recognition of the bit error by using time "b" and time "c", and further, selects a suspected part on the basis of the number "a" of testing blocks to be tested during one second. The memory testing processes A and B set, as a suspected range, a range of location that is a given size distant from a part at which the bit error occurred. Further, the memory testing processes A and B switch, at a regular cycle, a data pattern and an accessing method that are to be employed. Therefore, the memory testing processes A and B specify a data pattern and an accessing method used at a time of the occurrence of the bit error, by using time "b" and time "c". That is, the memory testing processes A and B may select a data pattern and an accessing method going back by elapse time from time "b" to time "c" on the basis of processing time needed for each data pattern and each accessing method.

Figure 14:
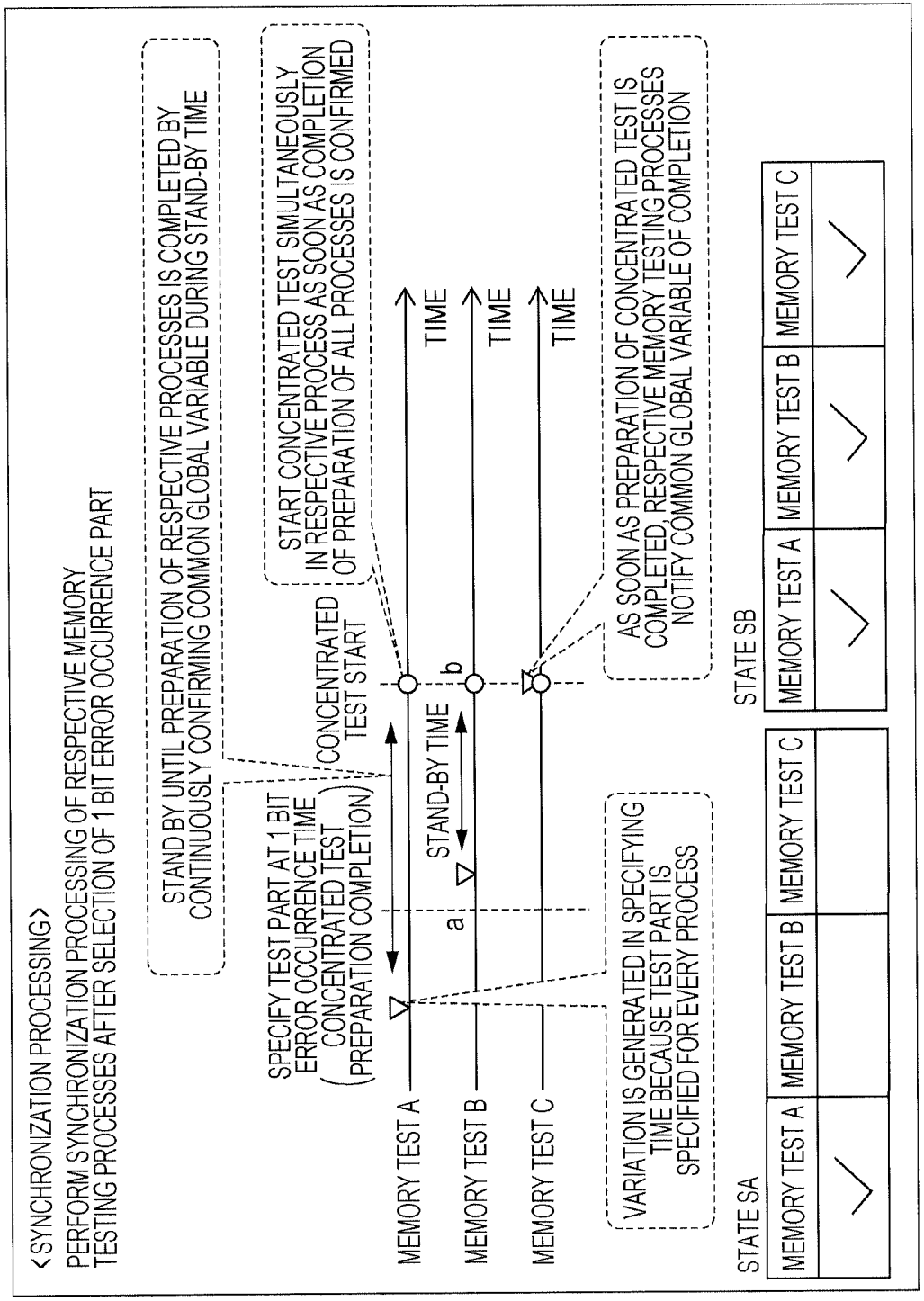
FIG. 14 is a diagram illustrating an example of a procedure of synchronization processing, according to an embodiment.

FIG. 14 is a diagram illustrating an example of a procedure of synchronization processing, according to an embodiment. FIG. 14 illustrates memory testing processes A, B, and C. There is variation in progress speeds of the respective memory testing processes A, B, and C. Therefore, in the second embodiment, the memory testing processes A, B, and C perform synchronization processing for synchronizing the memory testing processes.

For example, a testing part of the memory testing process A at a time of a bit error occurrence is first selected, and the memory testing process A enters a state in which a test is executable in a concentrated manner. Then, the memory testing process A sets a bit in a common global variable (array) (state SA). Subsequently, the memory testing process A confirms situations of other processes of the global variable. In this case, since selection has not been completed yet in the memory testing processes B and C, a bit of the common global variable has not been set yet. The memory testing process A enters a stand-by state and continuously confirms the common global variable so as to monitor situations of other processes.

Then, for example, a testing part of the memory testing process B at a time of the bit error occurrence is selected, and the memory testing process B enters a state in which a test is executable in a concentrated manner. The memory testing process B sets a bit in the common global variable (array) at ON. However, since selection in the memory testing process C has not been completed, a bit of the memory testing process C of the common global variable (array) has not been set at ON. Therefore, the memory testing process B enters a stand-by state. The memory testing process B continuously confirms the global variable so as to monitor the situation of other processes in a manner similar to the memory testing process A.

Further, a testing part of the memory testing process C at a time of the bit error occurrence is selected, and the memory testing process C enters a state in which a test is executable in a concentrated manner. The memory testing process C sets a bit in the common global variable (array) at ON. Since all the bits for the memory testing processes are set at ON, the memory testing processes A, B, and C start a concentrated test (state SB).

The memory testing processes A, B, and C specify a suspected range by going back to a part at which the bit error occurred. Then, the memory testing processes A, B, and C reproduce conditions in which the bit error occurred, by using a data pattern and an accessing method for which the bit error occurred, and repeat a memory test predetermined times.

After repeating the test predetermined times, the memory testing processes A, B, and C store a current bit error count value as an initial value. The memory testing processes A, B, and C move a testing address on which a test is to be performed, to an address next to the bit-error address at which the bit error occurred, and subsequently resume the memory test such as write-read/block move.

After completion of the memory test such as writing and reading of data and block move with respect to all the addresses of blocks of memories to be handled, the memory testing processes A, B, and C terminate the ECC check process for monitoring a bit error count.

Then, the CPU 1 executing the memory test program confirms a hard log, and supports quality determination by a user, based on presence/absence of a memory in which error occurrence frequency exceeds a threshold value of a bit error. In the case, a hard log check processing module or the like of the memory test program may judge information which is the basis for quality determination, such as presence/absence of an uncorrectable bit error and whether or not the number of occurrence times of a correctable bit error exceeds a threshold value.

Figure 15:
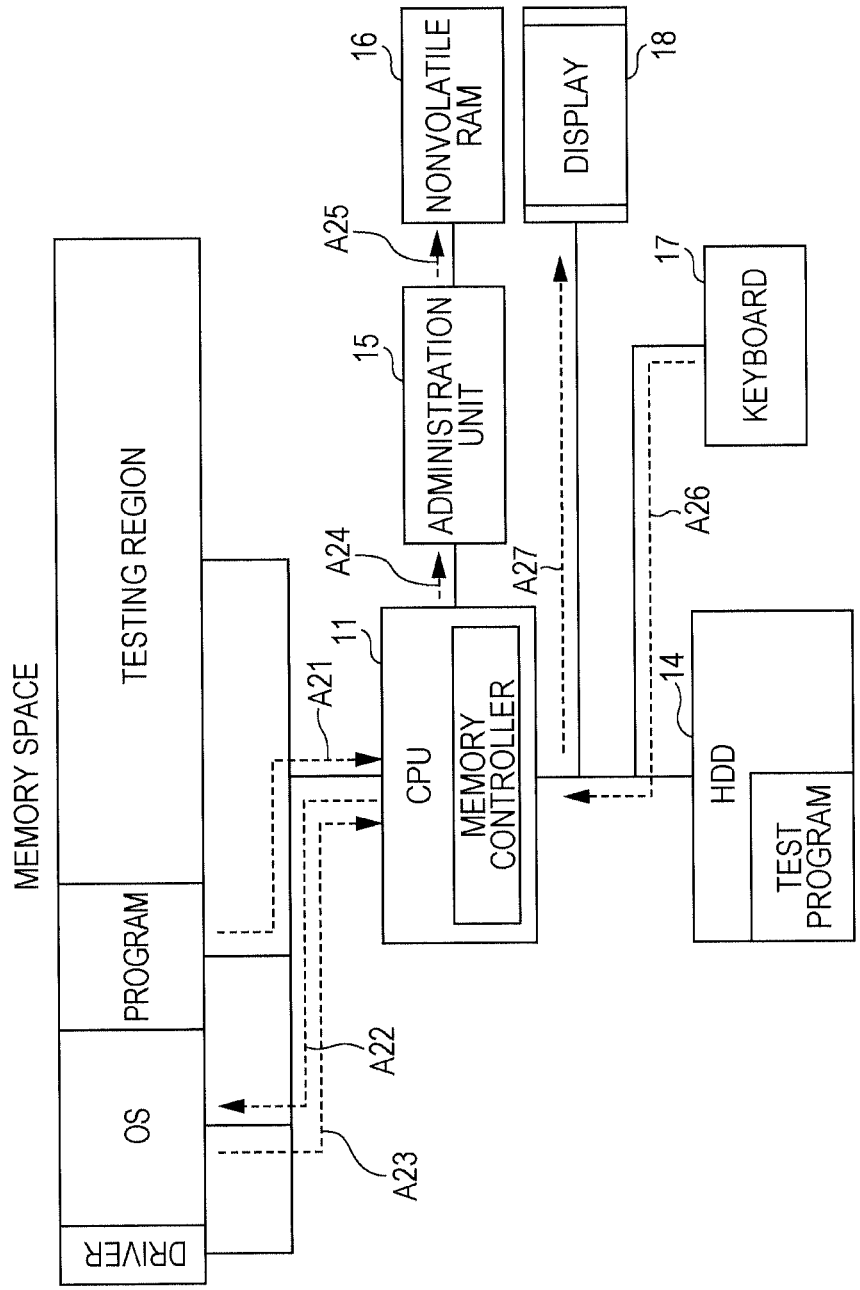
FIG. 15 is a diagram illustrating an example of a procedure for determining whether a test object memory is non-defective or defective, according to an embodiment.

FIG. 15 is a diagram illustrating an example of a procedure for determining whether a test object memory is non-defective or defective, according to an embodiment.

The memory test program issues a command for hard log acquisition to the OS via the CPU 1 (A21, A22). The OS extracts a hard log which is stored in the nonvolatile RAM 16 via the administration unit 15 (A23, A24, A25).

A user inputs a command by a keyboard operation or the like (A26), and allows the display 18 to display the extracted log (A27). The user confirms the display of the display 18 so as to perform determination of non-defective product/defective product.

Figure 16:
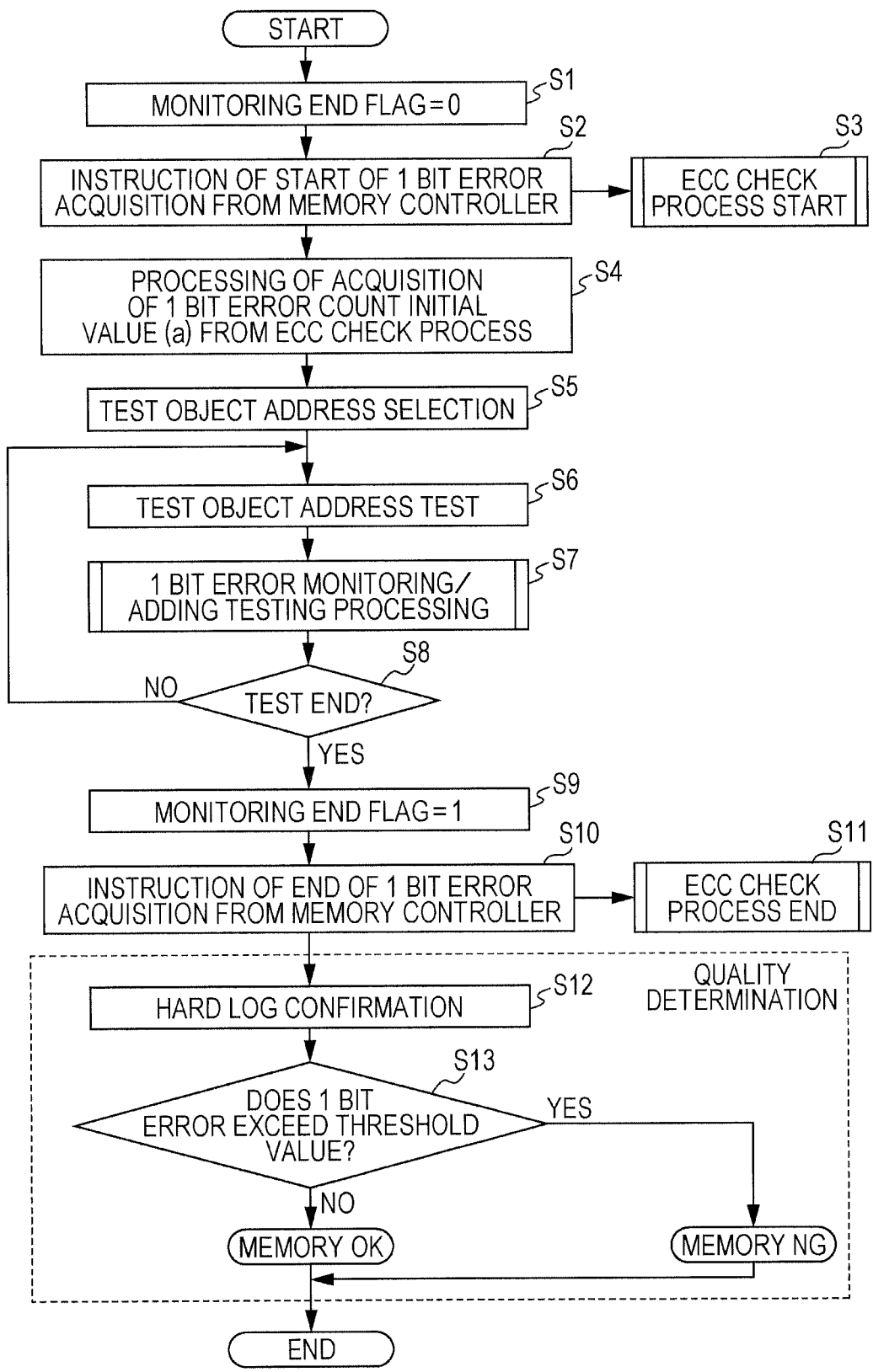
FIG. 16 is a diagram illustrating an example of an operational flowchart for a memory testing process, according to an embodiment.

FIG. 16 is a diagram illustrating an example of an operational flowchart for a memory testing process, according to an embodiment. That is, FIG. 16 illustrates an example of an operational flowchart performed by the memory test module. In this example, description is provided on the assumption that one core of the CPU 11 executes the memory testing process. Here, a plurality of cores may execute processing of FIG. 16 in a memory test. The memory testing process of the CPU 11 first sets a monitoring end flag at 0 (51).

Subsequent to the setting of operation 51, the memory testing process instructs the ECC check process to start acquisition of the number of occurrence times of a bit error from the memory controllers 12A and 12B (S2). The ECC check process starts processing in accordance with the instruction issued in operation S2 (S3).

Next, the memory testing process executes bit error count initial value acquisition processing for acquiring an initial value ("a") of the bit error count from the ECC check process (S4). That is, the memory testing process sets an initial value of the bit error count number.

Then, the memory testing process selects a test object address (S5). Subsequently, the memory testing process tests the test object address (S6). Here, the test object address is a set of addresses in a memory space, which correspond, for example, to the blocks C1, C2, and C3 of the memory depicted in FIG. 7. The CPU 11 of the information processing device 10 executes the processing of S6 as an example of a testing unit.

Next, the memory testing process executes bit error monitoring/adding testing processing (S7). Then, the memory testing process determines whether or not the test is ended (S8).

For example, it is determined that a test is ended when the test is completed predetermined times for an address range of a predetermined memory using a combination of predetermined data pattern and accessing method. When the test is not ended, the memory testing process returns the control to operation S6.

On the other hand, when the test is ended, the memory testing process sets a monitoring end flag at 1 (S9). Subsequent to the setting of S9, the memory testing process instructs the ECC check process to end bit error acquisition from the memory controllers 12A and 12B (S10). As a result, the ECC check process ends the processing (S11).

Next, the memory testing process confirms a hard log (S12). Then, the memory testing process determines whether or not the number of occurrence times of a bit error exceeds a threshold value (S13). When the number of occurrence times of a bit error does not exceed the threshold value (NO in operation S13), it is determined that a memory is a non-defective product (OK). On the other hand, when the number of occurrence times of a bit error exceeds the threshold value (YES in operation S13), it is determined that a memory is a defective product (NG).

Figure 17:
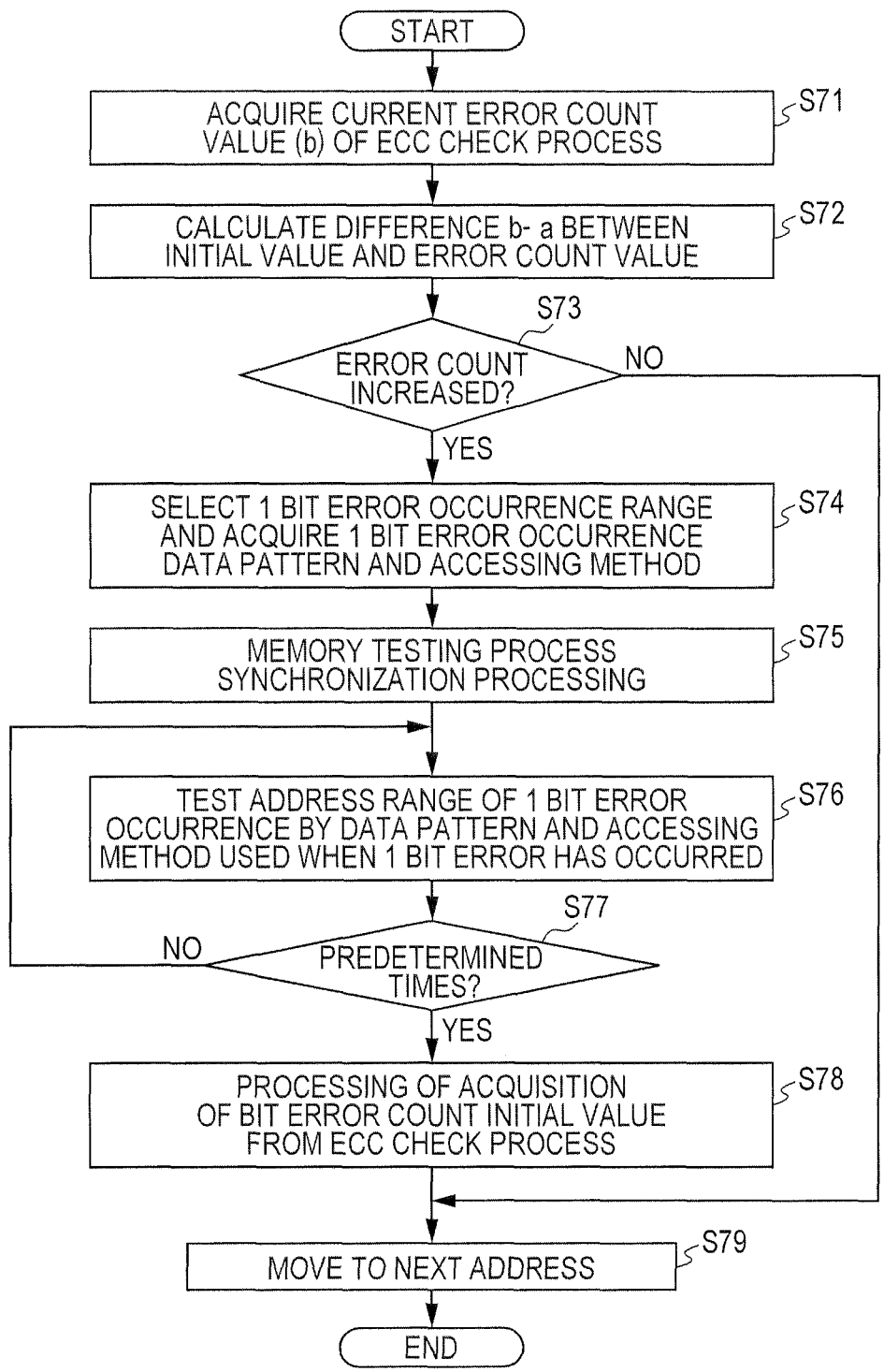
FIG. 17 is a diagram illustrating an example of an operational flowchart for bit error monitoring/adding testing processing, according to an embodiment.

FIG. 17 is a diagram illustrating an example of an operational flowchart for bit error monitoring/adding testing processing, according to an embodiment. FIG. 17 illustrates the detail of the bit error monitoring/adding testing processing depicted in operation S7 of FIG. 16. In this processing, the memory testing process acquires a current error count number ("b") of the ECC check process (S71). Then, the memory testing process calculates difference b-a between an initial value "a" of the count number acquired in S4 of FIG. 16 and a current error count number "b" (S72).

Then, the memory testing process determines whether or not the error count number has been increased (S73). When the error count number has not been increased (NO in operation S73), the memory testing process progresses the control to S79.

On the other hand, when the error count number has been increased (YES in operation S73), the memory testing process selects a bit error occurrence range and acquires a data pattern and an accessing method that were used at a time of an occurrence of a bit error (S74). Namely, as described in FIGS. 7 to 9, the memory testing process calculates the number of blocks from a bit error occurrence part on the basis of elapse time from the bit error occurrence. Then, each memory testing process specifies a testing part that was tested at an error occurrence time, on the basis of the calculated number of blocks. Further, the memory testing process acquires a data pattern and an accessing method that were used for a test on the test part at the bit error occurrence time. The CPU 11 of the information processing device 10 executes the processing of S74 as an example of a position specifying unit. The description of the procedure of S74 is omitted because the procedure has been described with reference to FIGS. 7 to 9. The CPU 11 of the information processing device 10 executes the processing of S74 as an example of a condition specifying unit.

Here, the operation S74 may be configured such that a bit error occurrence range and at least one of a data pattern and an accessing method that were used at the bit error occurrence time are acquired. For example, there is a case where all of a bit error occurrence range and a data pattern and an accessing method that were used at the bit error occurrence time do not have to be acquired depending on the system configuration. Then, the memory testing process executes memory testing process synchronization processing (S75). Details of the procedure of the memory testing process synchronization processing have been described with reference to FIG. 14, and the description thereof is omitted here. The CPU 11 of the information processing device 10 executes the operation S75 as an example of a synchronization control unit.

When the synchronization processing is completed and all the memory testing processes are synchronized with each other, a test on an address range in which a bit error occurred is executed again by using a data pattern and an accessing method used when the bit error occurred (S76). Since the details of the procedure of S76 have been described with reference to FIGS. 12 and 13, the description thereof is omitted here. The CPU 11 of the information processing device 10 executes the processing for the operation S76 as an example of a control unit.

Then, the memory testing process determines whether or not the processing for operation S76 is executed predetermined times (S77). Depending on the result of operation S77, the memory testing process executes the processing for operation S76 the predetermined times.

Next, the memory testing process executes processing of acquisition of bit error count initial value from the ECC check process (S78). Then, the memory testing process moves to the next address (S79).

Figure 18:
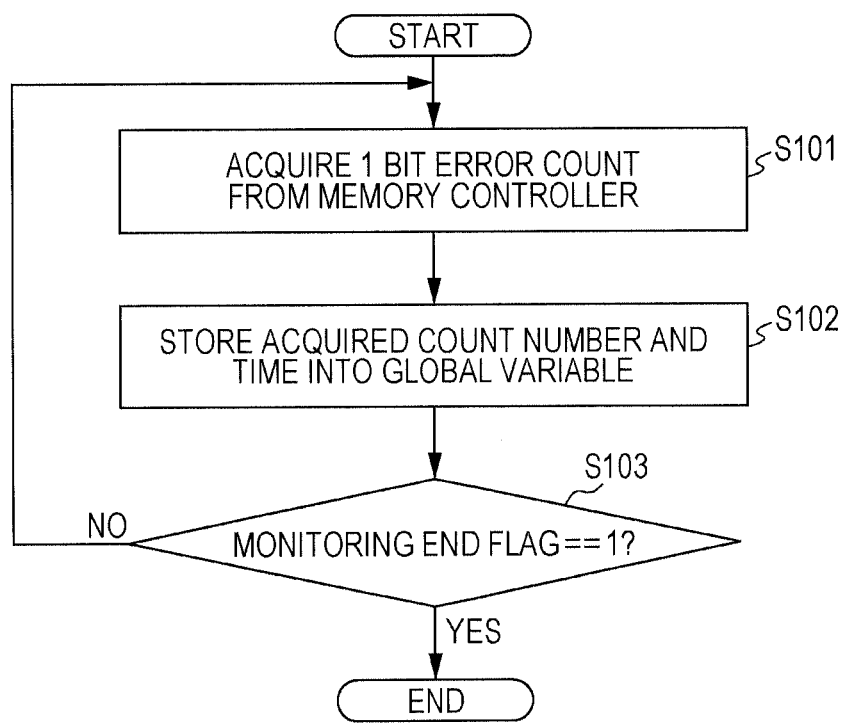
FIG. 18 is a diagram illustrating an example of an operational flowchart for an ECC check process, according to an embodiment.

FIG. 18 is a diagram illustrating an example of an operational flowchart for an ECC check process, according to an embodiment. Namely, FIG. 18 illustrates a processing example of a 1 bit error monitoring processing module. The processing of FIG. 18 is started when a monitoring end flag is set at 0. In this processing, the ECC check process acquires a bit error count value from a memory controller (S101). Then, the ECC check process stores the acquired error count value and time at which the error count value is acquired in a global variable (S102). The CPU 11 of the information processing device 10 executes the processing for operation S102 as an example of a correction time recording unit.

Then, the ECC check process determines whether or not the value of the monitoring end flag is 1 (S103). When the value of the monitoring end flag is 0, the ECC check process returns the control to operation S101. On the other hand, when the value of the monitoring end flag is 1, the ECC check process ends the processing.

Advantageous Effect

As described above, according to the test procedure of the information processing device 10 of the embodiment, a plurality of memory testing processes which are respectively executed by a plurality of cores may perform tests in parallel on a plurality of memories of a plurality of banks with respect to the combinations of various data patterns and accessing methods. When an ECC error occurs and error correction is executed in a test of a single memory testing process (for example, the memory testing process A of the CPU 1), each memory testing process acquires an address range, a data pattern, and an accessing method of the memory test which has been executed at the error occurrence time by the memory testing process A. Then, each memory testing process reproduces an address range, a data pattern, and an accessing method which are assumed to be the same as those handled by the memory testing process A at the error occurrence time.

Accordingly, it is possible to accurately reproduce a state at bit error occurrence time even when various data patterns and various accessing methods are combined unlike the comparison example using a single data pattern and a single accessing method.

Further, each memory testing process executes synchronization processing so as to more accurately reproduce conditions the same as those under which the memory testing process A was executed at the error occurrence time. Accordingly, even when an information processing device 10 employs a memory interleaving method in which a plurality of banks are accessed in parallel, the information processing device 10 is able to execute various memory tests using various data patterns and various accessing methods and able to accurately reproduce an error occurrence state. For example, it becomes easy to reproduce a situation at an error occurrence time, in which, for example, write-back from a cache occurs due to memory competition of a plurality of processes.

Further, a range on which a memory test is executed again when an error has occurred is a predetermined address range including an address on which the memory test was executed at the error occurrence time. Therefore, it is possible to reproduce an error occurrence condition including memory situations around an error occurrence bit on a physical memory. Then, the information processing device 10 executes a test in a concentrated manner with respect to a predetermined address range including an address corresponding to an error occurrence bit, so as to increase possibility that error occurrence frequency exceeds a predetermined threshold value for a memory having a potential of abnormality.

Modification

In the above-described first embodiment, the information processing device 10 in which the CPU 11 includes the CPU 1 to CPU 3 which are a plurality of cores is described as an example. However, the configuration of the information processing device 10 is not limited to the configurations of above-described first and second embodiments. For example, the information processing device 10 may have the configuration including a plurality of CPUs including a single core. Further, the information processing device 10 may have the configuration including a plurality of CPUs each including a plurality of cores. Further, the information processing device 10 may have the configuration on which one CPU including a single core is mounted. Further, the information processing device 10 may be configured not to employ memory interleaving. That is, the testing procedures of a memory illustrated in the first and second embodiments are applicable to an information processing device other than that of the first and second embodiments.

<<Computer Readable Recording Medium>>

A program which allows a computer or other machine or device (hereinafter, a computer or the like) to realize any one of the above-described functions may be recorded in a recording medium which is readable by a computer or the like. Then, a computer or the like may be allowed to read and execute the program of the recording medium so as to provide the functions.

Here, the recording medium which is readable by a computer or the like indicates a recording medium which is capable of accumulating information such as data and a program, which is readable from a computer or the like, by electric, magnetic, optical, mechanical, or chemical mechanism. Examples of a recording medium detachable from a computer or the like among such recording media include a flexible disk, a magneto optical disk, a CD-ROM, a CD-R/W, a DVD, a Blu-ray disk, a DAT, an 8 mm tape, and a memory card such as a flash memory. Further, examples of a recording medium which is fixed to a computer or the like include a hard disk and a read only memory (ROM).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing device, comprising:
  a storage device configured to include an error correction circuit; and
  a processor configured:
  to perform a test of the storage device according to a predetermined testing procedure;
  to record a first time-point at which error correction of the storage device has been performed by the error correction circuit during performance of the test;
  to determine, with predetermined accuracy, a first position within the storage device on which the error correction has been performed, based on a test speed at which the test is performed, a first time-period from the first time-point to current time, and a second position within the storage device on which the test is being performed at the current time; and
  to perform the test predetermined times on a first range included in the storage device and including the first position, according to a testing procedure that has been used at the first time-point.

2. The information processing device of claim 1, wherein when the processor performs, in parallel, a plurality of the tests on plural ranges in the storage device, the processor synchronizes starts of the plurality of the tests that are to be performed in parallel on the plural ranges including the first range.

3. The information processing device of claim 1, wherein when the processor performs the test plural times under a condition that is changed among a plurality of conditions each time the test is executed, the processor determines a test condition under which the test has been performed at the first time-point, based on the test speed and the first time-period.

4. A testing method executed by a computer, the testing method comprising:
  performing a test of a storage device including an error correction circuit, according to a predetermined testing procedure;
  recording a first time-point at which error correction of the storage device is performed by the error correction circuit during performance of the test;
  determining, with predetermined accuracy, a first position within the storage device on which the error correction has been performed, based on a test speed at which the test is performed, a first time-period from the first time-point to current time, and a second position within the storage device on which the test is being performed at the current time; and
  performing the test predetermined times on a first range included in the storage device and including the first position, according to a testing procedure that has been used at the first time-point.

5. The testing method of claim 4, further comprising:
  when performing in parallel a plurality of the tests on plural ranges in the storage device, synchronizing starts of the plurality of the tests that are to be performed in parallel on the plural ranges including the first range.

6. The testing method of claim 4, further comprising:
when performing the test plural times under a condition that is changed among a plurality of conditions each time the test is performed, determining a test condition under which the test has been performed at the first time-point, based on the test speed and the first time-period.

7. A non-transitory computer readable recording medium having stored therein a program for causing a computer to execute a process comprising:
performing a test of a storage device including an error correction circuit, according to a predetermined testing procedure;
recording a first time-point at which error correction of the storage device has been performed by the error correction circuit during performance of the test;
determining, with predetermined accuracy, a first position within the storage device on which the error correction has been performed, based on a test speed at which the test is performed, a first time-period from the first time-point to current time, and a second position within the storage device on which the test is being performed at the current time; and
performing the test predetermined times on a first range included in the storage device and including the first position, according to a testing procedure that has been used at the first time-point.

8. The non-transitory computer readable recording medium of claim 7, wherein the procedure further includes
when performing in parallel a plurality of the tests on plural ranges in the storage device, synchronizing starts of the plurality of the tests that are to be performed in parallel on the plural ranges including the first range.

9. The non-transitory computer readable recording medium of claim 7, wherein the process further includes
when performing the test plural times under a condition that is changed among a plurality of conditions each time the test is performed, determining a test condition under which the test has been performed at the first time-point, based on the test speed and the first time-period.

* * * * *